United States Patent
Feng et al.

(10) Patent No.: US 10,923,008 B2
(45) Date of Patent: Feb. 16, 2021

(54) SHIFT REGISTER AND METHOD OF DRIVING THE SAME, GATE DRIVING CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/511,765

(22) Filed: Jul. 15, 2019

(65) Prior Publication Data

US 2020/0020266 A1   Jan. 16, 2020

(30) Foreign Application Priority Data

Jul. 13, 2018   (CN) .......................... 201810775889.9

(51) Int. Cl.
   *G09G 3/20*   (2006.01)
   *G11C 19/18*  (2006.01)
   *G11C 19/28*  (2006.01)

(52) U.S. Cl.
   CPC ............. *G09G 3/20* (2013.01); *G11C 19/182* (2013.01); *G11C 19/28* (2013.01); *G09G 2310/0286* (2013.01)

(58) Field of Classification Search
   None
   See application file for complete search history.

(56) References Cited

U.S. PATENT DOCUMENTS

| 2010/0188385 A1 | 7/2010 | Boiko |
| 2013/0100007 A1* | 4/2013 | Yamamoto ............... G09G 3/36 345/100 |

(Continued)

FOREIGN PATENT DOCUMENTS

| CN | 101765876 A | 6/2010 |
| CN | 105047228 A | 11/2015 |

(Continued)

OTHER PUBLICATIONS

First Office Action issued in corresponding Chinese Application No. 201810775889.9, dated May 21, 2020, with English language translation.

*Primary Examiner* — Stephen T. Reed
(74) *Attorney, Agent, or Firm* — McDermott Will and Emery LLP

(57) ABSTRACT

A shift register includes a pull-up control circuit, at least two output circuits, a pull-down control circuit, at least two pull-down circuits, and at least two output signal terminals. The pull-up control circuit, the at least two output circuits, and the pull-down control circuit are respectively coupled to the pull-up node; the pull-down control circuit, the at least two pull-down circuits, and the pull-up control circuit are respectively coupled to the pull-down node. Each of the at least two output circuits is coupled to a corresponding one of the at least two output signal terminals; each of the at least two pull-down circuits is coupled to a corresponding one of the at least two output signal terminals; and each of the at least two output signal terminals is coupled to a corresponding one of at least two gate lines.

18 Claims, 12 Drawing Sheets

(56) References Cited

U.S. PATENT DOCUMENTS

2015/0263722 A1 9/2015 Kim et al.
2016/0217728 A1 7/2016 In et al.
2016/0358666 A1* 12/2016 Pang .................... G09G 3/3688
2016/0365061 A1 12/2016 Hong et al.

FOREIGN PATENT DOCUMENTS

| CN | 105068682 A | 11/2015 |
|---|---|---|
| CN | 105632562 A | 6/2016 |
| CN | 105825799 A | 8/2016 |
| CN | 106023943 A | 10/2016 |
| CN | 106683634 A | 5/2017 |
| KR | 10-2014-0079106 A | 6/2014 |
| KR | 10-2016-0004181 A | 1/2016 |
| KR | 10-2016-0070444 A | 6/2016 |

* cited by examiner (1)

SHIFT REGISTER AND METHOD OF DRIVING THE SAME, GATE DRIVING CIRCUIT, AND DISPLAY DEVICE

CROSS-REFERENCE TO RELATED APPLICATION

This application claims priority to and benefit of Chinese Patent Application No. 201810775889.9, filed on Jul. 13, 2018, titled "SHIFT REGISTER AND METHOD OF DRIVING THE SAME, GATE DRIVING CIRCUIT, AND DISPLAY DEVICE", which is incorporated herein by reference in its entirety.

TECHNICAL FIELD

The present disclosure relates to the field of display technologies, and in particular, to a shift register and a method of driving the same, a gate driving circuit, and a display device.

BACKGROUND

In order to achieve better display performance, gate driving circuits by using of the gate driver on array (GOA) technology are widely used in display devices including thin-film-transistor liquid-crystal displays (TFT LCDs) and organic light-emitting diodes (OLEDs).

SUMMARY

In an aspect, a shift register is provided. The shift register includes a pull-up control circuit, at least two output circuits, a pull-down control circuit, at least two pull-down circuits, and at least two output signal terminals.

The pull-up control circuit, the at least two output circuits, and the pull-down control circuit are respectively coupled to a pull-up node.

The pull-down control circuit, the at least two pull-down circuits, and the pull-up control circuit are respectively coupled to a pull-down node.

Each of the at least two output circuits is coupled to a corresponding one of the at least two output signal terminals.

Each of the at least two pull-down circuits is coupled to a corresponding one of the at least two output signal terminals.

Each of the at least two output signal terminals is coupled to a corresponding one of at least two gate lines.

The pull-up control circuit is configured to receive a first voltage signal, and transmit the first voltage signal to the pull-up node.

Each of the at least two output circuits is configured to transmit a scanning signal to a corresponding output signal terminal under control of a potential of the pull-up node.

The pull-down control circuit is configured to receive a first control signal, and transmit the first control signal to the pull-down node.

Each of the at least two pull-down circuits is configured to reset a corresponding output signal terminal under control of a potential of the pull-down node.

In some embodiments, the pull-up control circuit is further configured to receive a second voltage signal.

The pull-up control circuit includes a first pull-up control sub-circuit, a second pull-up control sub-circuit, a first reset sub-circuit, and a first energy storage sub-circuit that are respectively coupled to the pull-up node.

(2)

The first pull-up control sub-circuit is configured to transmit the first voltage signal to the pull-up node under control of an input signal.

The second pull-up control sub-circuit is further coupled to the pull-down node, and is configured to transmit the second voltage signal to the pull-up node under control of the potential of the pull-down node.

The first reset sub-circuit is configured to transmit the second voltage signal to the pull-up node under control of a first reset signal.

The first energy storage sub-circuit is configured to store a voltage of the pull-up node and discharge the pull-up node.

The pull-down control circuit includes a first pull-down control sub-circuit and a second pull-down control sub-circuit that are respectively coupled to the pull-down node.

The first pull-down control sub-circuit is configured to transmit the first control signal to the pull-down node under control of the first control signal.

The second pull-down control sub-circuit is further coupled to the pull-up node, and is configured to transmit the second voltage signal to the pull-down node under control of the potential of the pull-up node.

In some embodiments, in the pull-up control circuit:

The first pull-up control sub-circuit includes a first transistor; a gate of the first transistor is coupled to the input signal terminal that is configured to transmit an input signal, a first electrode of the first transistor is coupled to a first voltage terminal that is configured to transmit a first voltage signal, and a second electrode of the first transistor is coupled to the pull-up node;

The second pull-up control sub-circuit includes a second transistor; a gate of the second transistor is coupled to the pull-down node, a first electrode of the second transistor is coupled to a second voltage terminal that is configured to transmit the second voltage signal, and a second electrode of the second transistor is coupled to the pull-up node;

The reset sub-circuit includes a third transistor; a gate of the third transistor is coupled to a first reset signal terminal that is configured to transmit a first reset signal, a first electrode of the third transistor is coupled to the second voltage terminal, and a second electrode of the third transistor is coupled to the pull-up node;

The first energy storage sub-circuit includes at least two capacitors, one end of each of the at least two capacitors is coupled to the pull-up node, and another end of each of the at least two capacitors is coupled to a corresponding one of the at least two output signal terminals; or, the first energy storage sub-circuit includes a third capacitor, one end of the third capacitor is coupled to the pull-up node, and another end of the third capacitor is coupled to a cascade signal output terminal that is configured to transmit a cascade signal;

In the pull-down control circuit:

The first pull-down control sub-circuit includes a fourth transistor; a gate and a first electrode of the fourth transistor are respectively coupled to a first control signal terminal that is configured to transmit the first control signal, and a second electrode of the fourth transistor is coupled to the pull-down node;

The second pull-down control sub-circuit includes a fifth transistor; a gate of the fifth transistor is coupled to the pull-up node, a first electrode of the fifth transistor is coupled to the second voltage terminal, and a second electrode of the fifth transistor is coupled to the pull-down node.

In some embodiments, the pull-down control circuit is further configured to receive a second control signal, and transmit the second control signal to the pull-down node.

The pull-down control circuit further includes a first pull-down control alternate sub-circuit that is coupled to the pull-down node and configured to transmit the second control signal to the pull-down node under control of the second control signal.

The first pull-down control alternate sub-circuit includes an alternate transistor. A gate and a first electrode of the alternate transistor are respectively coupled to a second control signal terminal that is configured to transmit the second control signal, and a second electrode of the alternate transistor is coupled to the pull-down node.

The first pull-down control sub-circuit and the first pull-down control alternate sub-circuit are configured to work alternately; in a case where the first control signal is a working signal, the second control signal is a turn-off signal, or the second control signal terminal stops transmitting the second control signal; in a case where the second control signal is the working signal, the first control signal is the turn-off signal, or the first control signal terminal stops transmitting the first control signal.

In some embodiments, the shift register further includes a detection control circuit that is coupled to the pull-up node and configured to receive a third clock signal, and transmit the third clock signal to the pull-up node under control of a first clock signal and a second clock signal.

Each of the at least two output circuits is further configured to output a detection signal to a corresponding output signal terminal under control of the third clock signal received by the pull-up node.

In some embodiments, the detection control circuit includes a detection input sub-circuit, a second energy storage sub-circuit, an energy storage control sub-circuit, and a second reset sub-circuit.

The detection input sub-circuit, the second energy storage sub-circuit, and the energy storage control sub-circuit are respectively coupled to a first node. The energy storage control sub-circuit and the second reset sub-circuit are respectively coupled to the pull-up node.

The detection input sub-circuit is configured to receive an input signal, and transmit the input signal to the first node under control of the second clock signal. The detection input sub-circuit includes a sixth transistor; a gate of the sixth transistor is coupled to a second clock signal terminal that is configured to transmit the second clock signal, a first electrode of the sixth transistor is coupled to an input signal terminal that is configured to transmit the input signal, and a second electrode of the sixth transistor is coupled to the first node.

The second energy storage sub-circuit is configured to store a potential of the first node and discharge the first node. The second energy storage sub-circuit includes a fourth capacitor. One end of the fourth capacitor is coupled to the first node, and another end of the fourth capacitor is coupled to a second voltage terminal that is configured to transmit a second voltage signal.

The energy storage control sub-circuit is configured to receive a third clock signal, and transmit the third clock signal to the pull-up node under control of the potential of the first node and the first clock signal.

The energy storage control sub-circuit includes a seventh transistor and an eighth transistor. A gate of the seventh transistor is coupled to the first node, a first electrode of the seventh transistor is coupled to a third clock signal terminal that is configured to transmit the third clock signal, and a second electrode of the seventh transistor is coupled to a first electrode of the eighth transistor. A gate of the eighth transistor is coupled to a first clock signal terminal that is configured to transmit the first clock signal, and a second electrode of the eighth transistor is coupled to the pull-up node.

The second reset sub-circuit is configured to receive the second voltage signal, and transmit the second voltage signal to the pull-up node under control of a second reset signal.

The second reset sub-circuit includes a ninth transistor. A gate of the ninth transistor is coupled to a second reset signal terminal that is configured to transmit the second reset signal, a first electrode of the ninth transistor is coupled to the second voltage terminal, and a second electrode of the ninth transistor is coupled to the pull-up node.

In some embodiments, the shift register further includes a cascade output circuit, a cascade pull-down circuit, and a cascade signal output terminal.

The cascade output circuit is coupled to the pull-up node and the cascade signal output terminal, and is configured to output a cascade signal to the cascade signal output terminal under control of a potential of the pull-up node.

The cascade output circuit includes at least one transistor. A gate of one transistor of the at least one transistor is coupled to the pull-up node, a first electrode of the transistor is coupled to a fourth clock signal terminal that is configured to transmit a fourth clock signal, and a second electrode of the transistor is coupled to the cascade signal output terminal.

The cascade pull-down circuit is coupled to the pull-down node and the cascade signal output terminal, and is configured to reset the cascade signal output terminal under control of the potential of the pull-down node.

The cascade pull-down circuit includes at least one transistor. A gate of one transistor of the at least one transistor is coupled to the pull-down node, a first electrode of the transistor is coupled to a second voltage terminal that is configured to transmit a second voltage signal, and a second electrode of the transistor is coupled to the cascade signal output terminal.

In some embodiments, each output circuit includes at least one transistor. A gate of one transistor of the at least one transistor is coupled to the pull-up node, a first electrode of the transistor is coupled to a corresponding clock signal terminal, and a second electrode of the transistor is coupled to a corresponding one of the at least two output signal terminals.

Each pull-down circuit includes at least one transistor. A gate of one transistor of the at least one transistor is coupled to the pull-down node, a first electrode of the transistor is coupled to a third voltage terminal that is configured to transmit a third voltage signal, and a second electrode of the transistor is coupled to a corresponding one of the at least two output signal terminals.

In some embodiments, the at least two output circuits include a first output circuit and a second output circuit.

The at least two pull-down circuits include a first pull-down circuit and a second pull-down circuit.

The at least two output signal terminals include a first output signal terminal and a second output signal terminal.

The first output circuit and the first pull-down circuit are respectively coupled to the first output signal terminal, and the second output circuit and the second pull-down circuit are respectively coupled to the second output signal terminal.

In some embodiments, the pull-up control circuit is further configured to receive a second voltage signal. The pull-up control circuit includes a first transistor, a second transistor, a third transistor, a first capacitor, and a second capacitor.

A gate of the first transistor is coupled to an input signal terminal that is configured to transmit an input signal, a first electrode of the first transistor is coupled to a first voltage terminal that is configured to transmit a first voltage signal, and a second electrode of the first transistor is coupled to the pull-up node.

A gate of the second transistor is coupled to the pull-down node, a first electrode of the second transistor is coupled to a second voltage terminal that is configured to transmit a second voltage signal, and a second electrode of the second transistor is coupled to the pull-up node.

A gate of the third transistor is coupled to a first reset signal terminal that is configured to transmit a first reset signal, a first electrode of the third transistor is coupled to the second voltage terminal, and a second electrode of the third transistor is coupled to the pull-up node.

One end of the first capacitor is coupled to the pull-up node, and another end of the first capacitor is coupled to the first output signal terminal.

One end of the second capacitor is coupled to the pull-up node, and another end of the second capacitor is coupled to the second output signal terminal.

The pull-down control circuit includes a fourth transistor and a fifth transistor. A gate and a first electrode of the fourth transistor are respectively coupled to a first control signal terminal that is configured to transmit the first control signal, and a second electrode of the fourth transistor is coupled to the pull-down node. A gate of the fifth transistor is coupled to the pull-up node, a first electrode of the fifth transistor is coupled to a second voltage terminal, and a second electrode of the fifth transistor is coupled to the pull-down node.

The shift register further includes a detection control circuit, and the detection control circuit includes a sixth transistor, a fourth capacitor, a seventh transistor, an eighth transistor, and a ninth transistor.

A gate of the sixth transistor is coupled to a second clock signal terminal that is configured to transmit a second clock signal, a first electrode of the sixth transistor is coupled to the input signal terminal, and a second electrode of the sixth transistor is coupled to a first node.

One end of the fourth capacitor is coupled to the first node, and another end of the fourth capacitor is coupled to the second voltage terminal.

A gate of the seventh transistor is coupled to the first node, a first electrode of the seventh transistor is coupled to a third clock signal terminal that is configured to transmit a third clock signal, and a second electrode of the seventh transistor is coupled to a first electrode of the eighth transistor.

A gate of the eighth transistor is coupled to a first clock signal terminal that is configured to transmit a first clock signal, and a second electrode of the eighth transistor is coupled to the pull-up node.

A gate of the ninth transistor is coupled to a second reset signal terminal that is configured to transmit a second reset signal, a first electrode of the ninth transistor is coupled to the second voltage terminal, and a second electrode of the ninth transistor is coupled to the pull-up node.

The first output circuit includes a tenth transistor. A gate of the tenth transistor is coupled to the pull-up node, a first electrode of the tenth transistor is coupled to a fourth clock signal terminal that is configured to transmit a fourth clock signal, and a second electrode of the tenth transistor is coupled to the first output signal terminal.

The second output-circuit includes an eleventh transistor. A gate of the eleventh transistor is coupled to the pull-up node, a first electrode of the eleventh transistor is coupled to a fifth clock signal terminal that is configured to transmit a fifth clock signal, and a second electrode of the eleventh transistor is coupled to the second output signal terminal.

The first pull-down circuit includes a twelfth transistor. A gate of the twelfth transistor is coupled to the pull-down node, a first electrode of the twelfth transistor is coupled to a third voltage terminal that is configured to transmit a third voltage signal, and a second electrode of the twelfth transistor is coupled to the first output signal terminal.

The second pull-down circuit includes a thirteenth transistor. A gate of the thirteenth transistor is coupled to the pull-down node, a first electrode of the thirteenth transistor is coupled to the third voltage terminal, and a second electrode of the thirteenth transistor is coupled to the second output signal terminal.

Transistors included in the shift register are all N-type transistors.

The first voltage signal is a high level voltage signal, the second voltage signal is a low level voltage signal, and the third voltage signal is a low level voltage signal; and a voltage value of the second voltage signal is less than or equal to a voltage value of the third voltage signal.

In some embodiments, the pull-up control circuit is further configured to receive a second voltage signal.

The pull-up control circuit includes a first transistor, a second transistor, a third transistor, and a third capacitor.

A gate of the first transistor is coupled to an input signal terminal that is configured to transmit an input signal, a first electrode of the first transistor is coupled to a first voltage terminal that is configured to transmit a first voltage signal, and a second electrode of the first transistor is coupled to the pull-up node.

A gate of the second transistor is coupled to the pull-down node, a first electrode of the second transistor is coupled to a second voltage terminal that is configured to transmit the second voltage signal, and a second electrode of the second transistor is coupled to the pull-up node.

A gate of the third transistor is coupled to a first reset signal terminal that is configured to transmit a first reset signal, a first electrode of the third transistor is coupled to the second voltage terminal, and a second electrode of the third transistor is coupled to the pull-up node.

One end of the third capacitor is coupled to the pull-up node, and another end of the third capacitor is coupled to a cascade signal output terminal that is configured to transmit a cascade signal.

The pull-down control circuit includes a fourth transistor and a fifth transistor.

A gate and a first electrode of the fourth transistor are respectively coupled to a first control signal terminal that is configured to transmit the first control signal, and a second electrode of the fourth transistor is coupled to the pull-down node.

A gate of the fifth transistor is coupled to the pull-up node, a first electrode of the fifth transistor is coupled to a second voltage terminal, and a second electrode of the fifth transistor is coupled to the pull-down node.

The shift register further includes a detection control circuit, and the detection control circuit includes a sixth transistor, a fourth capacitor, a seventh transistor, an eighth transistor, a ninth transistor, and a first node.

A gate of the sixth transistor is coupled to a second clock signal terminal that is configured to transmit a second clock signal, a first electrode of the sixth transistor is coupled to the input signal terminal, and a second electrode of the sixth transistor is coupled to the first node.

One end of the fourth capacitor is coupled to the first node, and another end of the fourth capacitor is coupled to the second voltage terminal.

A gate of the seventh transistor is coupled to the first node, a first electrode of the seventh transistor is coupled to a third clock signal terminal that is configured to transmit a third clock signal, and a second electrode of the seventh transistor is coupled to a first electrode of the eighth transistor.

A gate of the eighth transistor is coupled to a first clock signal terminal that is configured to transmit a first clock signal, and a second electrode of the eighth transistor is coupled to the pull-up node.

A gate of the ninth transistor is coupled to a second reset signal terminal that is configured to transmit a second reset signal, a first electrode of the ninth transistor is coupled to the second voltage terminal, and a second electrode of the ninth transistor is coupled to the pull-up node.

The first output circuit includes a tenth transistor. A gate of the tenth transistor is coupled to the pull-up node, a first electrode of the tenth transistor is coupled to a fourth clock signal terminal that is configured to transmit a fourth clock signal, and a second electrode of the tenth transistor is coupled to the first output signal terminal.

The second output-circuit includes an eleventh transistor. A gate of the eleventh transistor is coupled to the pull-up node, a first electrode of the eleventh transistor is coupled to a fifth clock signal terminal that is configured to transmit a fifth clock signal, and a second electrode of the eleventh transistor is coupled to the second output signal terminal.

The first pull-down circuit includes a twelfth transistor. A gate of the twelfth transistor is coupled to the pull-down node, a first electrode of the twelfth transistor is coupled to a third voltage terminal that is configured to transmit a third voltage signal, and a second electrode of twelfth transistor is coupled to the first output signal terminal.

The second pull-down circuit includes a thirteenth transistor. A gate of the thirteenth transistor is coupled to the pull-down node, a first electrode of the thirteenth transistor is coupled to the third voltage terminal, and a second electrode of the thirteenth transistor is coupled to the second output signal terminal.

The shift register further includes a cascade output circuit, a cascade pull-down circuit, and a cascade signal output terminal.

The cascade output circuit includes a fourteenth transistor. A gate of the fourteenth transistor is coupled to the pull-up node, a first electrode of the fourteenth transistor is coupled to a sixth clock signal terminal that is configured to transmit a sixth clock signal, and a second electrode of the fourteenth transistor is coupled to the cascade signal output terminal.

The cascade pull-down circuit includes a fifteenth transistor. A gate of the fifteenth transistor is coupled to the pull-down node, a first electrode of the fifteenth transistor is coupled to the second voltage terminal, and a second electrode of the fifteenth transistor is coupled to the cascade signal output terminal.

Transistors included in the shift register are all N-type transistors.

The first voltage signal is a high level voltage signal, the second voltage signal is a low level voltage signal, and the third voltage signal is a low level voltage signal; and a voltage value of the second voltage signal is less than or equal to a voltage value of the third voltage signal.

In some embodiments, the shift register further includes at least two additional output circuits, at least two additional pull-down circuits, and at least two additional output signal terminals.

The at least two additional output circuits are coupled to the pull-up node, and the at least two additional pull-down circuits are coupled to the pull-down node. Each of the at least two additional output circuits is coupled to a corresponding one of the at least two additional output signal terminals, and each of the at least two additional pull-down circuits is coupled to a corresponding one of the at least two additional output signal terminals.

Each of the at least two additional output signal terminals is coupled to a corresponding one of the at least two gate lines; the at least two additional output signal terminals are in one-to-one correspondence with the at least two output signal terminals; and a gate line to which each additional output signal terminal is coupled and another gate line to which a corresponding output signal terminal is coupled are configured to drive a same row of sub-pixels.

Each of the at least two additional output circuits is configured to output an additional scanning signal to a corresponding additional output signal terminal under control of the first voltage signal at the pull-up node.

Each of the at least two additional pull-down circuits is configured to reset a corresponding additional output signal terminal under control of the first control signal at the pull-down node.

In some embodiments, the at least two additional output circuits include a first additional output circuit and a second additional output circuit. The at least two additional pull-down circuits include a first additional pull-down circuit and a second additional pull-down circuit. The at least two additional output signal terminals include a first additional output signal terminal and a second additional output signal terminal.

The first additional output circuit and the first additional pull-down circuit are respectively coupled to the first additional output signal terminal, and the second additional output circuit and the second additional pull-down circuit are respectively coupled to the second additional output signal terminal.

The first additional output circuit includes a sixteenth transistor. A gate of the sixteenth transistor is coupled to the pull-up node, a first electrode of the sixteenth transistor is coupled to a seventh clock signal terminal that is configured to transmit a seventh clock signal, and a second electrode of the sixteenth transistor is coupled to the first additional output signal terminal.

The second additional output circuit includes a seventeenth transistor. A gate of the seventeenth transistor is coupled to the pull-up node, a first electrode of the seventeenth transistor is coupled to an eighth clock signal terminal that is configured to transmit an eighth clock signal, and a second electrode of the seventeenth transistor is coupled to the second additional output signal terminal.

The first additional pull-down circuit includes an eighteenth transistor. A gate of the eighteenth transistor is coupled to the pull-down node, a first electrode of the eighteenth transistor is coupled to a third voltage terminal that is configured to transmit a third voltage signal, and a second electrode of the eighteenth transistor is coupled to the first additional output signal terminal.

The second additional pull-down circuit includes a nineteenth transistor. A gate of the nineteenth transistor is coupled to the pull-down node, a first electrode of the nineteenth transistor is coupled to the third voltage terminal, and a second electrode of the nineteenth transistor is coupled to the second additional output signal terminal.

In another aspect, a gate driving circuit is provided. The gate driving circuit includes at least two shift registers described above coupled in cascade.

In some embodiments, an input signal terminal of a first-stage shift register is coupled to a start signal terminal that is configured to transmit a start signal. Except for a last-stage shift register, one of at least two output signal terminals of each of remaining stages of shift registers is coupled to an input signal terminal of a next-stage shift register. Except for a first-stage shift register, one of at least two output signal terminals of each of remaining stages of shift registers is coupled to a first reset signal terminal of a previous-stage shift register. A first reset signal terminal of the last-stage shift register is coupled to a termination signal terminal that is configured to transmit a termination signal.

In some embodiments, in a case where each stage of shift register further includes a cascade signal output terminal, an input signal terminal of a first-stage shift register is coupled to a start signal terminal that is configured to transmit a start signal. Except for a last-stage shift register, a cascade signal output terminal of each of remaining stages of shift registers is coupled to an input signal terminal of a next-stage shift register. Except for a first-stage shift register, a cascade signal output terminal of each of remaining stages of shift registers is coupled to a first reset signal terminal of a previous-stage shift register. A first reset signal terminal of the last-stage shift register is coupled to a termination signal terminal that is configured to transmit a termination signal.

In a case where each stage of shift register further includes a sixth clock signal terminal, the gate driving circuit further includes two sixth clock signal lines. A sixth clock signal terminal of a shift register in an odd-number-th stage is coupled to one sixth clock signal line of the two sixth clock signal lines. A sixth clock signal terminal of a shift register in an even-number-th stage is coupled to another sixth clock signal line of the two sixth clock signal lines.

In yet another aspect, a display device is provided. The display device includes the gate driving circuit described above, and a plurality of gate lines.

The plurality of gate lines are divided into at least two gate line groups, and each gate line group includes at least two gate lines that are arranged in sequence. At least two stages of shift registers in the gate driving circuit are in one-to-one correspondence with the at least two gate line groups, and each of the at least two output signal terminals of each stage of shift register is coupled to a corresponding one of the at least two gate lines of a corresponding gate line group.

In yet another aspect, a method of driving a shift register is provided. The method is configured to drive the shift register described above.

In a case where an image frame includes a display phase the method includes:

In a first time period of the display period, receiving, by the pull-up control circuit, a first voltage signal; transmitting, by the pull-up control circuit, the first voltage signal to the pull-up node under control of an input signal; and storing, by the pull-up control circuit, a potential of the pull-up node; transmitting, by each of the at least two output circuits, a non-operating voltage of a corresponding clock signal to a corresponding one of the at least two output signal terminals under control of the potential of the pull-up node, the corresponding clock signal being from a corresponding one of at least two clock signal terminals to which each output circuit is connected;

In a second time period of the display period, discharging, by the pull-up control circuit, the pull-up node; transmitting, by each of the at least two output circuits, an operating voltage of the corresponding clock signal as a scanning signal to a corresponding one of the at least two output signal terminals under control of the potential of the pull-up node;

In a third time period of the display period, receiving, by the pull-up control circuit, a second voltage signal; and transmitting, by the pull-up control circuit, the second voltage signal to the pull-up node under control of a first reset signal; receiving, by the pull-down control circuit, a first control signal; and transmitting, by the pull-down control circuit, the first control signal to the pull-down node; and receiving, by each of the at least two pull-down circuits, a third voltage signal; and transmitting, by each of the at least two pull-down circuits, the third voltage signal to a corresponding one of the at least two output signal terminals under control of a potential of the pull-down node, so as to reset a corresponding one of the at least two output signal terminals.

In some embodiments, in a case where the shift register further includes a detection control circuit, the method further includes:

In the first time period, storing, by the detection control circuit, a voltage of the input signal under control of a second clock signal;

In a case where the image frame further includes a blank period after the display period, the method further includes:

In a fourth time period of the blank period, releasing, by the detection control circuit, a stored voltage; receiving, by the detection control circuit, a first clock signal; and transmitting, by the detection control circuit, the first clock signal to the pull-up node; transmitting, by each of the at least two output circuits, an operating voltage of the corresponding clock signal as a detection signal to a corresponding one of the at least two output signal terminals under control of the potential of the pull-up node;

In a fifth time period of the blank period, transmitting, by the detection control circuit, the second voltage signal to the pull-up node under control of a second reset signal; receiving, by the pull-down control circuit, a first control signal; and transmitting, by the pull-down control circuit, the first control signal to the pull-down node; and transmitting, by each of the at least two pull-down circuits, the third voltage signal to a corresponding one of the at least two output signal terminals under control of the potential of the pull-down node, so as to reset the corresponding one of the at least two output signal terminals.

In some embodiments, in a case where the shift register further includes a cascade output circuit, a cascade pull-down circuit, and a cascade signal output terminal.

The method further includes:

In the first time period, transmitting, by the cascade output circuit, a non-operating voltage of a sixth clock signal from a sixth clock signal terminal to the cascade signal output terminal under control of the potential of the pull-up node;

In the second time period, transmitting, by the cascade output circuit, an operating voltage of the sixth clock signal as a cascade signal to the cascade signal output terminal under control of the potential of the pull-up node; and In the third time period, transmitting, by the cascade pull-down circuit, the second voltage signal to the cascade signal output terminal under control of the potential of the pull-down node, so as to reset the cascade signal output terminal.

BRIEF DESCRIPTION OF THE DRAWINGS

In order to describe technical solutions in embodiments of the present disclosure more clearly, the accompanying drawings to be used in the description of the present disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Unless otherwise defined, technical terms or scientific terms used herein shall be of ordinary meaning as understood by those skilled in the art. The words "first", "second" and similar terms used in the description and claims of the present disclosure do not denote any order, quantity, or importance, but are merely used to distinguish between different components. The words "include" or "comprise", etc. are intended to mean that an element or object that precedes the word includes an element or object listed after the word and equivalents thereof, and does not exclude other element or object. The words "connected" or "connection", etc. are not limited to physical or mechanical connections, but may include electrical connections, whether direct or indirect. "Upper", "lower", "left", "right", etc. are only used to indicate corresponding positional relationships, and when the absolute position of the described object is changed, the relative positional relationship is also changed accordingly.

A gate driveing circuit by using of the GOA technology (i.e., GOA circuit) includes a plurality of shift registers. An output signal terminal of each shift register is coupled to a corresponding gate line, and is configured to scan the gate line (i.e., transmit a scanning signal to the gate line), so as to turn on a row of sub-pixels coupled to the gate line. Since each shift register includes a detection circuit, a display circuit, and a connecting circuit, a structure of the GOA circuit including the plurality of shift registers is very complicated, and the GOA circuit occupies a large area in the display device. As a result, it is difficult to reduce a width of a frame of the display device.

Figure 1:
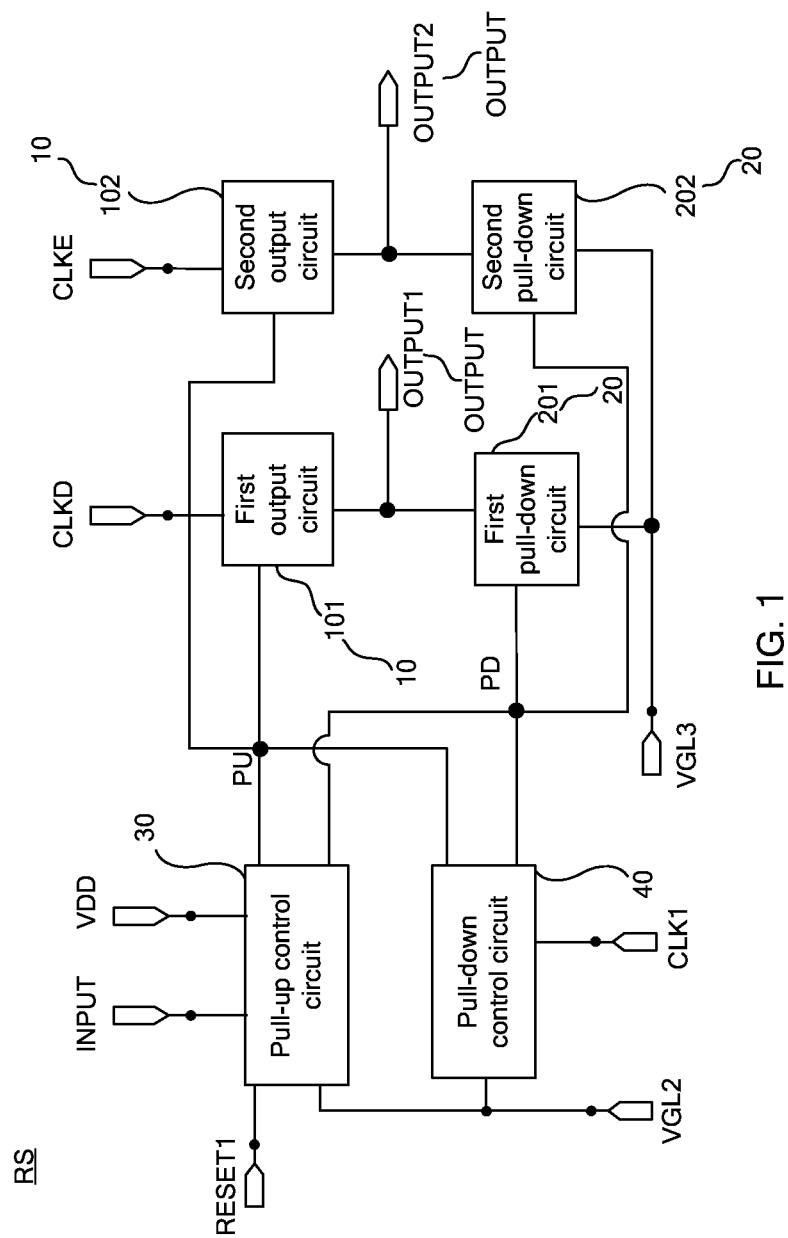
FIG. 1 is a schematic diagram showing circuits in a shift register, in accordance with some embodiments.
Figure 2:
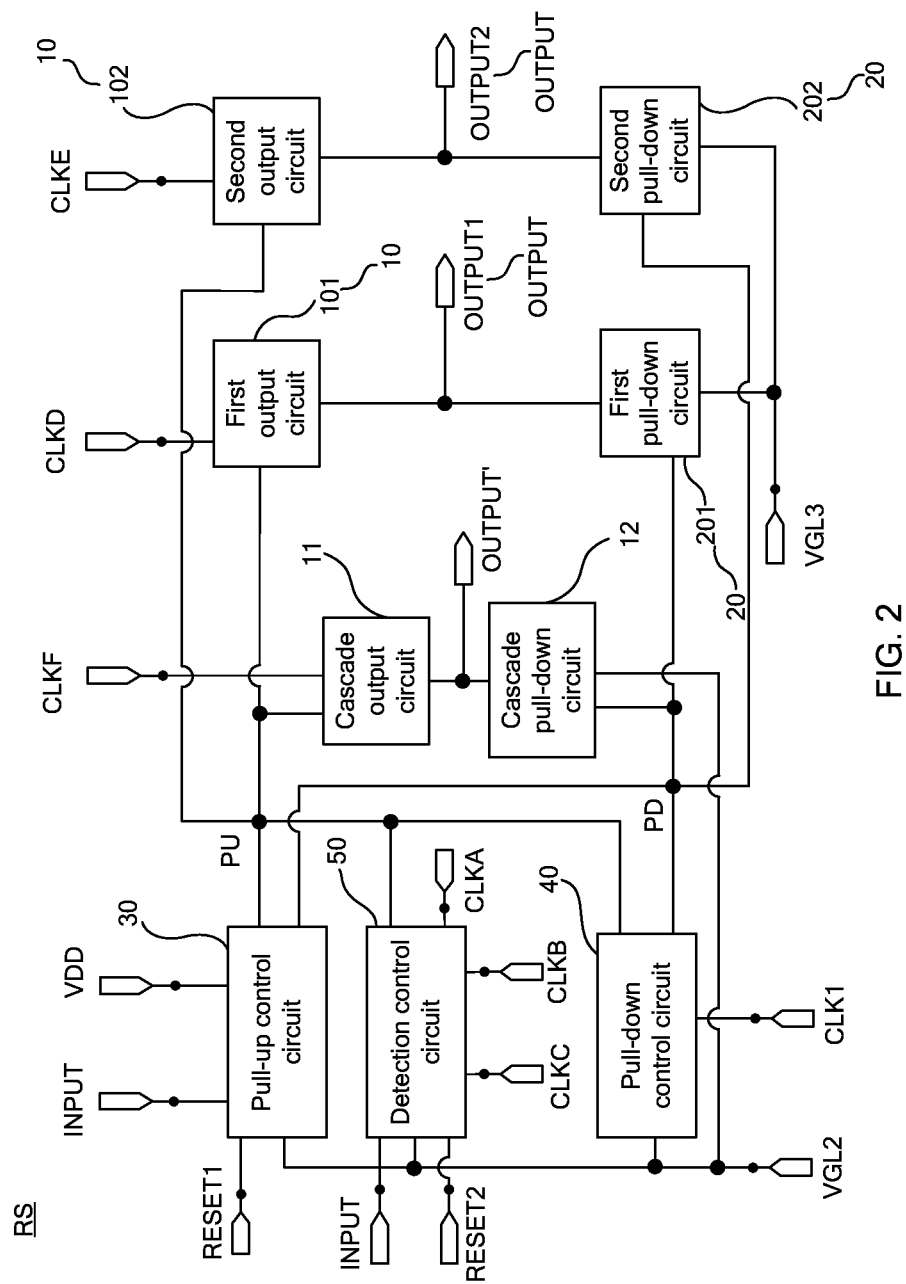
FIG. 2 is a schematic diagram showing circuits in another shift register, in accordance with some embodiments.

For this reason, some embodiments of the present disclosure provide a shift register RS. As shown in FIGS. 1 and 2, the shift register RS includes a pull-up control circuit 30, at least two output circuits 10, a pull-down control circuit 40, at least two pull-down circuits 20, a pull-up node PU, a pull-down node PD, and at least two output signal terminals OUTPUT.

The pull-up control circuit 30, the at least two output circuits 10, and the pull-down control circuit 40 are respectively coupled to the pull-up node PU. The pull-down control circuit 40, the at least two pull-down circuits 20, and the pull-up control circuit 30 are respectively coupled to the pull-down node PD.

Each of the at least two output circuits 10 is coupled to a corresponding one of the at least two output signal terminals OUTPUT. Each of the at least two pull-down circuits 20 is coupled to a corresponding one of the at least two output signal terminals OUTPUT. Each of the at least two output signal terminals OUTPUT is coupled to a corresponding one of at least two gate lines.

The pull-up control circuit 30 is configured to receive a first voltage signal Vdd, and transmit the first voltage signal Vdd to the pull-up node PU.

Each of the at least two output circuits 10 is configured to transmit a received scanning signal to a corresponding output signal terminal under the control of a potential of the pull-up node PU.

The pull-down control circuit 40 is configured to receive a first control signal Clk1, and transmit the first control signal Clk1 to the pull-down node PD.

Each of the at least two pull-down circuits 20 is configured to reset a corresponding output signal terminal OUTPUT under the control of a potential of the pull-down node PD.

Based on this, some embodiments of the present disclosure provide a shift register RS, the shift register RS is provided with the at least two output signal terminals OUTPUT that are respectively coupled to the at least two gate lines. Moreover, through a control of the pull-up control circuit 30 over the potential of the pull-up node PU, the at least two output signal terminals OUTPUT may sequentially transmit corresponding scanning signals. In this way, the at least two gate lines may be turned on row by row, so as to enable a display device including the shift register RS to display. In addition, in some embodiments, by using the pull-down control circuit 40 to control the potential of the pull-down node PD, it may be possible to make the at least two output signal terminals OUTPUT stop transmitting corresponding scanning signals, so as to reset the at least two output signal terminals OUTPUT, and achieve the purpose of denoising the at least two output signal terminals OUTPUT.

In some embodiments, by setting the at least two output signal terminals OUTPUT in a single shift register RS, it may be possible to reduce a number of shift registers RS in a GOA circuit while ensuring that a number of output signal terminals OUTPUT is the same. In this way, while ensuring that the GOA circuit outputs scanning signals to the plurality of gate lines of the display device row by row, it may be possible to simplify an overall structure of the GOA circuit, which is conducive for reducing a frame width of the display device.

It will be noted that, specific structures of the pull-up control circuit 30 and the pull-down control circuit 40 included in the shift register RS (for example, arrangement of elements including the number and type of transistors and the number of capacitors in the circuits) are not specifically limited by some embodiments of the present disclosure, and may be set according to actual needs, as long as by using the pull-up control circuit 30 and the pull-down control circuit 40 to separately control potentials of the pull-up node PU and the pull-down node PD, it is possible to make the at least two output signal terminals OUTPUT transmit signals normally.

In addition, some embodiments of the present disclosure do not limit that signals transmitted by the at least two output signal terminals OUTPUT in the above embodiment are only scanning signals. Depending on different operating stages of the shift register RS, the signals transmitted by the at least two output signal terminals OUTPUT may be different. For example, in a blank period of an image frame, the signals transmitted by the at least two output signal terminals OUTPUT are detection signals. The detection signals are configured to turn on the at least two gate lines correspondingly coupled to the at least two output signal terminals OUTPUT, so as to compensate for threshold voltages of driving transistors coupled to each of the at least two gate lines in the display device. In addition, under the control of the pull-up control circuit 30, the pull-up node PU has two states: an operating state, for example, a state in which the pull-up node PU is at a high potential (or, a low potential); and a non-operating state, for example, a state in which the pull-up node PU is at a low potential (or, a high potential). Under the control of the pull-down control circuit 40, the pull-down node PD has two states: an operating state, for example, a state in which the pull-down node PD is at a high potential (or, a low potential); and an non-operating state, for example, a state in which the pull-down node PD is at a low potential (or, a high potential).

It will be understood that, by using the pull-up control circuit 30 to control the pull-up node PU, the at least two output circuits 10 can be controlled to transmit scanning signals. By using the pull-down control circuit 40 to control the pull-down node PD, the at least two output signal terminals OUTPUT can be reset, so as to control the at least two output circuits 10 to stop transmitting scanning signals.

Figure 3:
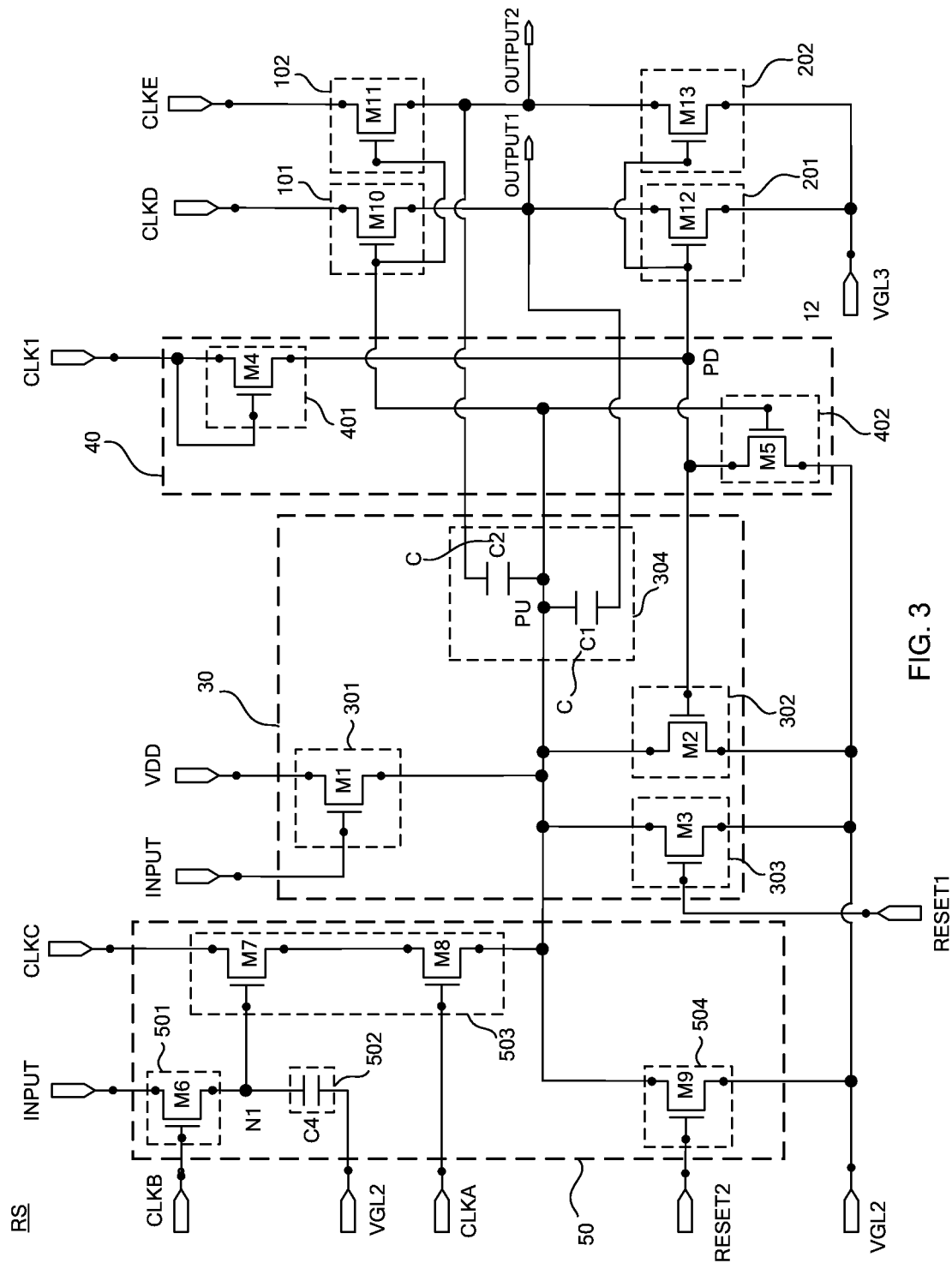
FIG. 3 is a schematic diagram showing a specific structure of a shift register, in accordance with some embodiments.
Figure 4:
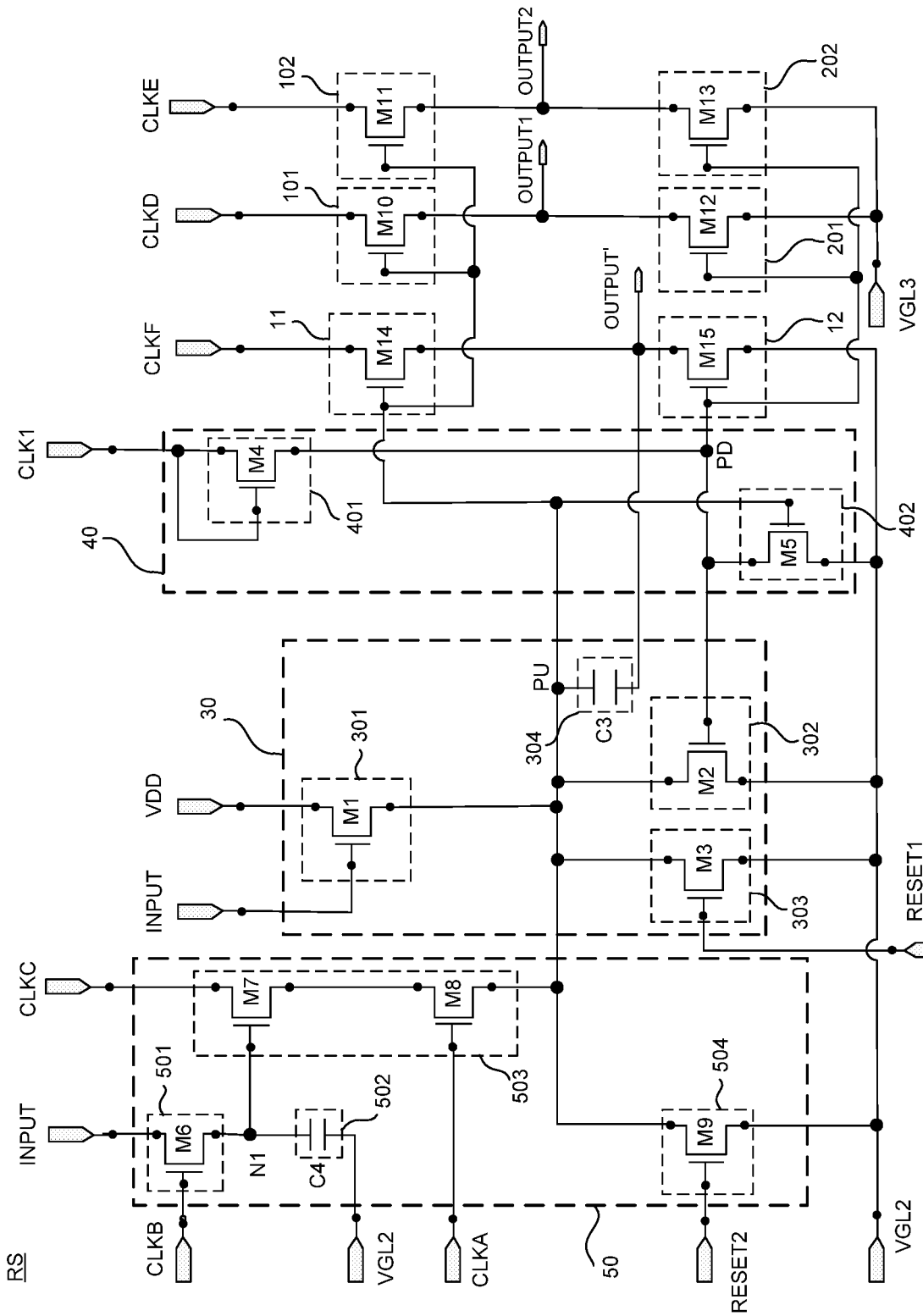
FIG. 4 is a schematic diagram showing a specific structure of another shift register, in accordance with some embodiments.
Figure 5:
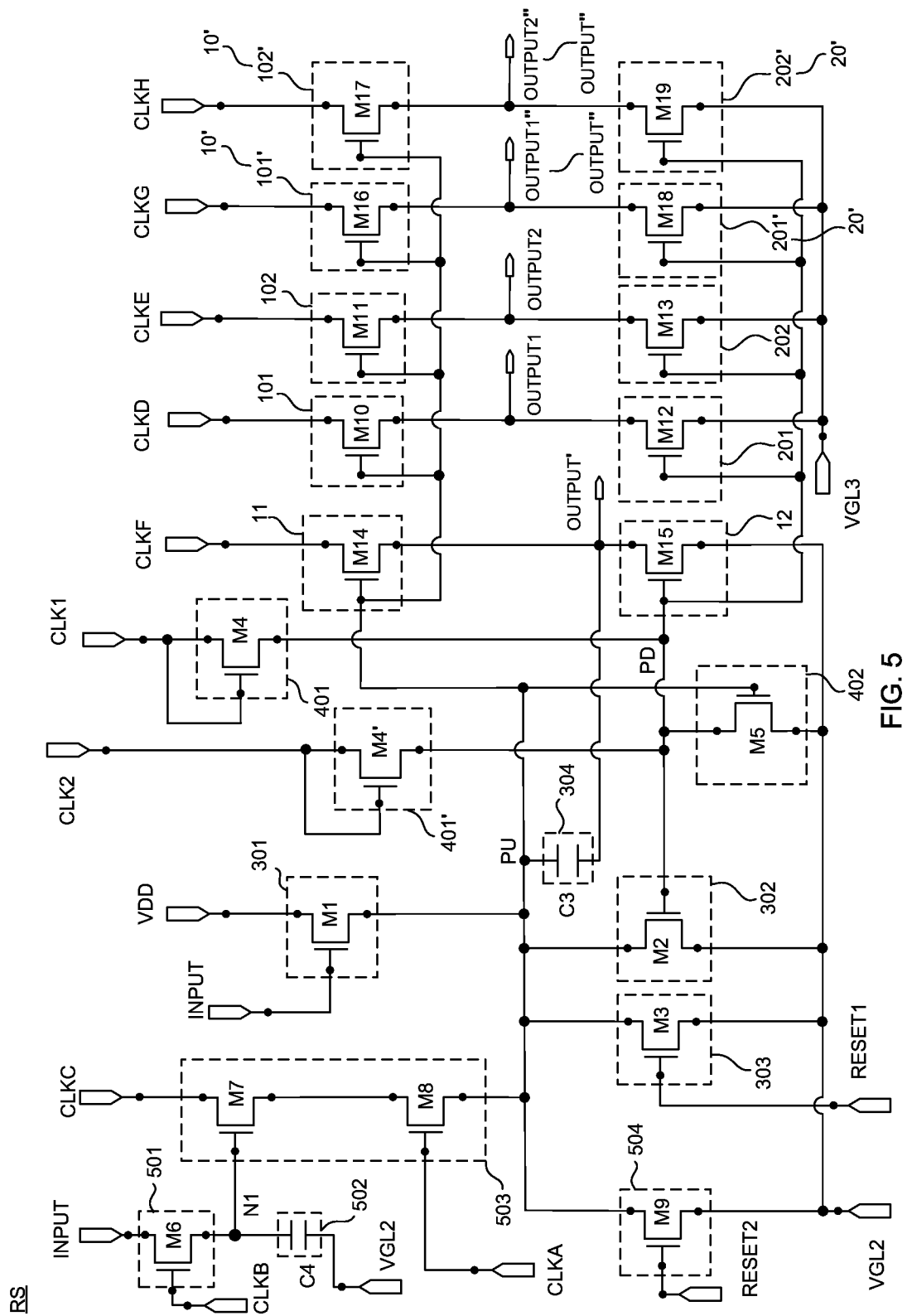
FIG. 5 is a schematic diagram showing a specific structure of yet another shift register, in accordance with some embodiments.

As shown in FIGS. 3 to 5, in some embodiments, each of the at least two output circuits 10 includes at least one transistor. A gate of one transistor of the at least one transistor is coupled to the pull-up node PU, a first electrode of the transistor is coupled to a corresponding clock signal terminal, and a second electrode of the transistor is coupled to a corresponding one of the at least two output signal terminals OUTPUT.

For example, the at least two output circuits 10 include two output circuits 10, in which one output circuit 10 includes a tenth transistor M10, and another output circuit 10 includes an eleventh transistor M11. Gates of M10 and M11 are both coupled to the pull-up node PU, and first electrodes of M10 and M11 are respectively coupled to a fourth clock signal terminal CLKD and a fifth clock signal terminal CLKE. Second electrodes of M10 and M11 are respectively coupled to a first output signal terminal OUTPUT1 and a second output signal terminal OUTPUT2.

Since the fourth clock signal terminal CLKD and the first output signal terminal OUTPUT1 are respectively coupled to M10, M10 may be turned on under the control of the potential of the pull-up node PU, and transmit a fourth clock signal Clkd from the fourth clock signal terminal CLKD to the first output signal terminal OUTPUT1, so as to scan a gate line that is coupled to the first output signal terminal OUTPUT1. Similarly, since the fifth clock signal terminal CLKE and the second output signal terminal OUTPUT2 are respectively coupled to M11, M11 may be turned on under the control of the potential of the pull-up node PD, and transmit a fifth clock signal Clke from the fifth clock signal terminal CLKE to the second output signal terminal OUTPUT2, so as to scan another gate line that is coupled to the second output signal terminal OUTPUT2.

In some other embodiments, each output circuit 10 includes a plurality of transistors (for example, two transistors). A gate of each transistor is coupled to the pull-up node PU, a first electrode of each transistor is coupled to a same clock signal terminal corresponding to the output circuit 10, and a second electrode of each transistor is coupled to a same output signal terminal corresponding to the output circuit 10. In this way, in a same output circuit, in a case where one transistor fails, the remaining transistor(s) may still be turned on under the control of the potential of the pull-up node PU, and transmit a clock signal from a clock signal terminal that is coupled to the remaining transistor(s) to a corresponding output signal terminal, so as to scan a gate line that is coupled to the output signal terminal.

As shown in FIGS. 3 to 5, in some embodiments, each of the at least two pull-down circuits 20 includes at least one transistor. A gate of one transistor of the at least one transistor is coupled to the pull-down node PD, a first electrode of the transistor is coupled to a third voltage signal that is configured to transmit a third voltage signal Vgl3, and a second electrode of the transistor is coupled to a corresponding one of the at least two output signal terminals OUTPUT.

For example, the at least two pull-down circuits 20 include two pull-down circuits 20, in which one pull-down circuit 20 includes a twelfth transistor M12, and another pull-down circuit 20 includes a thirteenth transistor M13. Gates of M12 and M13 are both coupled to the pull-down node PD, and first electrodes of M12 and M13 are both coupled to the third voltage terminal VGL3, and the third voltage terminal VGL3 is configured to receive a third voltage signal Vgl3. Second electrodes of M12 and M13 are respectively coupled to the first output signal terminal OUTPUT1 and the second output signal terminal OUTPUT2.

Since the third voltage terminal VGL3 and the first output signal terminal OUTPUT1 are respectively coupled to M12, M12 may be turned on under the control of the potential of the pull-down node PD, and transmit the third voltage signal Vgl3 from the third voltage terminal VGL3 to the first output signal terminal OUTPUT1, so as to reset the first output signal terminal OUTPUT1 and achieve the purpose of denoising the first output signal terminal OUTPUT1. Similarly, since the third voltage terminal VGL3 and the second output signal terminal OUTPUT2 are respectively coupled to M13, M13 may be turned on under the control of the potential of the pull-down node PD, and transmit a third voltage signal Vgl3 from the third voltage terminal VGL3 to the second output signal terminal OUTPUT2, so as to reset the second output signal terminal OUTPUT2 and achieve the purpose of denoising the second output signal terminal OUTPUT2.

In some other embodiments, each pull-down circuit 20 includes a plurality of transistors (for example, two transistors). A gate of each transistor is coupled to the pull-down node PD, a first electrode of each transistor is coupled to the third voltage terminal VGL3, and a second electrode of each transistor is coupled to a same output signal terminal corresponding to the pull-down circuit 20. In this way, in a same pull-down circuit 20, in a case where one transistor fails, the remaining transistor(s) may still be turned on under the control of the potential of the pull-down node PD, and transmit the third voltage signal Vgl3 from the third voltage terminal VGL3 that is coupled to the remaining transistor(s) to a corresponding output signal terminal, so as to reset the output signal terminal and achieve the purpose of denoising the output signal terminal.

As shown in FIGS. 3 to 5, in some embodiments, the pull-up control circuit 30 includes a first pull-up control sub-circuit 301, a second pull-up control sub-circuit 302, a first reset sub-circuit 303, and a first energy storage sub-circuit 304, which are respectively coupled to the pull-up node PU.

The first pull-up control sub-circuit 301 is configured to output the first voltage signal Vgl1 to the pull-up node PU under the control of an input signal Input.

Herein, the first voltage terminal VGL1 is configured to receive the first voltage signal Vgl1. Since the first voltage signal Vgl1 is generally a power supply voltage signal Vdd, in the following embodiments and the drawings, the first voltage signal is labeled as Vdd, and the first voltage terminal VGL1 is labeled as VDD.

The second pull-up control sub-circuit 302 is further coupled to the pull-down node PD, and is configured to output a second voltage signal Vgl2 to the pull-up node PU under the control of the potential of the pull-down node PD.

The first reset sub-circuit 303 is configured to transmit the second voltage signal Vgl2 to the pull-up node PU under the control of a first reset signal Reset1.

The first energy storage sub-circuit 304 is configured to store a potential of the pull-up node PU and discharge the pull-up node PU. Depending on different operation stages of the shift register RS, in some stages, the potential of the pull-up node PU is stored by the first energy storage sub-circuit 304, and in other stages, the potential of the pull-up node PU is released by the first energy storage sub-circuit 304.

For example, as shown in FIGS. 3 and 4, a structure of the pull-up control circuit 30 is described below.

The first pull-up control sub-circuit 301 includes a first transistor M1. A gate of the first transistor M1 is coupled to the input signal terminal INPUT that is configured to receive the input signal terminal Input, a first electrode of the first transistor M1 is coupled to the first voltage terminal VDD that is configured to transmit the first voltage terminal Vdd, and a second electrode of the first transistor M1 is coupled to the pull-up node PU. The first transistor M1 is configured to be turned on under the control of the input signal Input, and output the first voltage signal Vdd to the pull-up node PU.

The second pull-up control sub-circuit 302 includes a second transistor M2. A gate of the second transistor M2 is coupled to the pull-down node PD, a first electrode of the second transistor M2 is coupled to the second voltage terminal VGL2 that is configured to transmit the second voltage signal Vgl2, and a second electrode of the second transistor M2 is coupled to the pull-up node PU. The second transistor M2 is configured to be turned on under the control of the potential of the pull-down node PD, and output the second voltage signal Vgl2 to the pull-up node PU.

The reset sub-circuit 303 includes a third transistor M3. A gate of the third transistor M3 is coupled to a first reset signal terminal RESET1 that is configured to transmit a first reset signal Reset1, a first electrode of the third transistor M3 is coupled to the second voltage terminal VGL2, and a second electrode of the third transistor M3 is coupled to the pull-up node PU. The third transistor M3 is configured to be turned on under the control of the first reset signal Reset1, and output the second voltage signal Vgl2 to the pull-up node PU.

The above register RS is applied to the GOA circuit. In general, the GOA circuit includes at least two shift registers RS described above coupled in cascade. In some embodiments, each stage of shift register RS does not include a cascade signal output terminal OUTPUT', and adjacent two stages of shift registers RS are cascaded through an output signal terminal OUTPUT. As shown in FIG. 3, the first energy storage sub-circuit 304 includes at least two capacitors C. One end of each of the at least two capacitors C is coupled to the pull-up node PU, and another end of each of the at least two capacitors C is coupled to a corresponding one of the at least two output signal terminals OUTPUT.

In some other embodiments, each stage of shift register RS further includes a cascade signal output terminal OUTPUT' that is configured to transmit a cascade signal. That is, adjacent two stages of shift registers RS are cascaded through a cascade signal output terminal OUTPUT'. As shown in FIGS. 4 and 5, the first energy storage sub-circuit 304 includes a third capacitor C3. One end of the third capacitor C3 is coupled to the pull-up node PU, and another end of the third capacitor C3 is coupled to a cascade signal output terminal OUTPUT'.

In some embodiments, as shown in FIGS. 3 to 5, the pull-down control circuit 40 includes a first pull-down control sub-circuit 401 and a second pull-down control sub-circuit 402, which are respectively coupled to the pull-down node PD.

The first pull-down control sub-circuit 401 is configured to transmit the first control signal Clk1 to the pull-down node PD under the control of the first control signal Clk1.

The second pull-down control sub-circuit 402 is further coupled to the pull-up node PU, and is configured to transmit the second voltage signal Vgl2 to the pull-down node PD under the control of the potential of the pull-up node PU.

For example, as shown in FIGS. 3 to 5, a structure of the pull-down control circuit 40 is described below.

The first pull-down control sub-circuit 401 includes a fourth transistor M4. A gate and a first electrode of the fourth transistor M4 are respectively coupled to a first control signal terminal CLK1 that is configured to transmit the first control signal Clk1, and a second electrode of the fourth transistor M4 is coupled to the pull-down node PD. The fourth transistor M4 is configured to be turned on under the control of the first control signal Clk1, and transmit the first control signal Clk1 to the pull-down node PD.

The second pull-down control sub-circuit 402 includes a fifth transistor M5. A gate of the fifth transistor M5 is coupled to the pull-up node PU, a first electrode of the fifth transistor M5 is coupled to the second voltage terminal VGL2, and a second electrode of the fifth transistor M5 is coupled to the pull-down node PD. The fifth transistor M5 is configured to be turned on under the control of the potential of the pull-up node PU, and transmit the second voltage signal Vgl2 to the pull-down node PD.

In the first pull-down control sub-circuit 401, the received first control signal Clk1 from the first control signal terminal CLK1 is constantly at a same potential (for example, a high potential, referring to subsequent FIGS. 8A and 8B for details), which means that a transistor (e.g., the fourth transistor M4) in the first pull-down control sub-circuit 401 is constantly turned on under the control of the received first control signal Clk1, which may cause damage to the transistor in the first pull-down control sub-circuit 401.

Based on this, in some embodiments, as shown in FIG. 5, the pull-down control circuit 40 further includes a first pull-down control alternate sub-circuit 401' that is coupled to the pull-down node PD and configured to transmit the second control signal Clk2 to the pull-down node PD under the control of the second control signal Clk2.

For example, the first pull-down control alternate sub-circuit 401' includes an alternate transistor M4'. A gate and a first electrode of the alternate transistor M4' are respectively coupled to a second control signal terminal CLK2 that is configured to transmit the second control signal Clk2, and a second electrode of the alternate transistor M4' is coupled to the pull-down node PD. The alternate transistor M4' is configured to be turned on under the control of the second control signal Clk2, and transmit the second control signal Clk2 to the pull-down node PD.

The first pull-down control sub-circuit 401 and the first pull-down control alternate sub-circuit 401' are configured to work alternately, so as to avoid damage to transistors in the two circuits.

A manner of realizing an alternate operation of the two circuits is as follows: in a case where the first control signal is a working signal, the second control signal is a turn-off signal, or the second control signal terminal stops transmitting the second control signal; in a case where the second control signal is the working signal, the first control signal is the turn-off signal, or the first control signal terminal stops transmitting the first control signal.

Herein, the working signal refers to a signal capable of turning on the fourth transistor M4 in the first pull-down control sub-circuit 401 and the alternate transistor M4' in the first pull-down control alternate sub-circuit 401'; and the turn-off signal refers to a signal capable of turning off the fourth transistor M4 in the first pull-down control sub-circuit 401 and the alternate transistor M4' in the first pull-down control alternate sub-circuit 401'.

In some examples, the first control signal Clk1 and the second control signal Clk2 are square-wave signals. When the first control signal Clk1 is at a high level, the second control signal Clk2 is at a low level; when the first control signal Clk1 is at a low level, the second control signal Clk2 is at a high level. The first control signal Clk1 is switched between high level and low level, for example, every 1 s, 2 s, 4 s, or other time periods. Accordingly, the second control signal Clk2 is switched between low level and high level, for example, every 1 s, 2 s, 4 s, or other time periods.

In some other examples, the first control signal Clk1 and the second control signal Clk2 are both constant direct current (DC) signals. In this case, if the transistors in the first pull-down control sub-circuit 401 and the first pull-down control alternate sub-circuit 401' are both configured to be turned on under the control of a high level, the first control signal Clk1 and the first the second control signal Clk2 are both high level DC signals, only that the first control signal terminal CLK1 and the second control signal terminal CLK2 alternately stop transmitting the first control signal Clk1 and the second control signal Clk2 respectively. That is, when the first control signal Clk1 is at a high level, the second control signal terminal CLK2 stops transmitting the second control signal Clk2; when the second control signal Clk2 is at a high level, the first control signal terminal CLK1 stops transmitting the first control signal Clk1. In this way, an effect that the first control signal terminal CLK1 and the second control signal terminal CLK2 alternately transmit high levels is realized.

Alternatively, if the transistors in the first pull-down control sub-circuit 401 and the first pull-down control alternate sub-circuit 401' are both configured to be turned on under the control of a low level, the first control signal Clk1 and the first the second control signal Clk2 are both low level direct current (DC) signals, only that the first control signal terminal CLK1 and the second control signal terminal CLK2 alternately stop transmitting the first control signal Clk1 and the second control signal Clk2 respectively. That is, when the first control signal Clk1 is at a low level, the second control signal terminal CLK2 stops transmitting the second control signal Clk2; when the second control signal Clk2 is at a low level, the first control signal terminal CLK1 stops transmitting the first control signal Clk1. In this way, the effect that the first control signal terminal CLK1 and the second control signal terminal CLK2 alternately transmit low levels is realized.

In some embodiments, as shown in FIGS. 2 to 4, the shift register RS further includes a detection control circuit 50 that is coupled to the pull-up node PU and configured to receive a third clock signal Clkc, and transmit the third clock signal Clkc to the pull-up node PU under the control of a first clock signal Clka and a second clock signal Clkb. Correspondingly, each of the at least two output circuits 10 is further configured to output a detection signal to a corresponding output signal terminal OUTPUT under the control of the third clock signal Clkc received by the pull-up node PU.

In a case where a shift register RS including the detection control circuit 50 is applied to a display device, detection signals from respective output signal terminals OUTPUT are configured to compensate for threshold voltages of driving transistors in pixel driving circuits in the display device.

In this way, for each shift register RS, the detection control circuit 50 in the shift register RS shares the at least two outputs 10 with circuits for driving display (including the pull-up control circuit 30 and the pull-down control circuit 40). As a result, a structure of each shift register RS is further simplified. That is, a structure of a GOA circuit including a plurality of the above shift registers RS is simplified, thereby reducing a frame width of the display device including the GOA circuit.

In some embodiments, as shown in FIGS. 3 and 4, the detection control circuit 50 includes a detection input sub-circuit 501, a second energy storage sub-circuit 502, an energy storage control sub-circuit 503, a second reset sub-circuit 504, and a first node N1.

The detection input sub-circuit 501, the second energy storage sub-circuit 502, and the energy storage control sub-circuit 503 are respectively coupled to the first node N1. The energy storage control sub-circuit 503 and the second reset sub-circuit 504 are respectively coupled to the pull-up node PU.

The detection input sub-circuit 501 is configured to receive an input signal Input, and transmit the input signal Input to the first node N1 under the control of the second clock signal Clkb.

The input signal Input received by the detection input sub-circuit 501 is the same as the input signal Input that controls the first pull-up control sub-circuit 301 described above. In some examples, the two input signals are from a same input signal terminal INPUT, in other examples, the two input signals are from different input signal terminals INPUT, which is not limited by some embodiments of the present disclosure.

The second energy storage sub-circuit 502 is configured to store a potential of the first node N1 and discharge the first node N1. Depending on different operation stages of the shift register RS, in some stages, the potential of the first node N1 is stored by the second energy storage sub-circuit 502, and in other stages, the potential of the first node N1 is released by the second energy storage sub-circuit 502.

The energy storage control sub-circuit 503 is configured to transmit the received third clock signal Clkc to the pull-up node PU under the control of the potential of the first node N1 and the first clock signal Clka.

The second reset sub-circuit 504 is configured to receive the second voltage signal Vgl2, and transmit the second voltage signal Vgl2 to the pull-up node PU under the control of the second reset signal Reset2.

For example, the detection input sub-circuit 501 includes a sixth transistor M6. A gate of the sixth transistor M6 is coupled to a second clock signal terminal CLKB that is configured to transmit the second clock signal Clkb, a first electrode of the sixth transistor M6 is coupled to an input signal terminal INPUT that is configured to transmit the input signal Input, and a second electrode of the sixth transistor M6 is coupled to the first node N1. The sixth transistor M6 is configured to be turned on under the control of the second clock signal Clkb, and transmit the input signal Input to the first node N1.

The second energy storage sub-circuit 502 includes a fourth capacitor C4. One end of the fourth capacitor C4 is coupled to the first node N1, and another end of the fourth capacitor C4 is coupled to a second voltage terminal VGL2 that is configured to transmit a second voltage signal VGL2.

The energy storage control sub-circuit 503 includes a seventh transistor M7 and an eighth transistor M8. A gate of the seventh transistor M7 is coupled to the first node N1, a first electrode of the seventh transistor M7 is coupled to a third clock signal terminal CLKC that is configured to transmit the third clock signal Clkc, and a second electrode of the seventh transistor M7 is coupled to a first electrode of the eighth transistor M8. A gate of the eighth transistor M8 is coupled to a first clock signal terminal CLKA that is configured to transmit the first clock signal Clka, and a second electrode of the eighth transistor M8 is coupled to the pull-up node PU. The seventh transistor M7 is configured to be turned on under the control of the potential of the first node N1, and transmit the received third clock signal Clkc to the eighth transistor M8. The eight transistor M8 is configured to be turned on under the control of the received first clock signal Clka, and transmit the third clock signal Clkc to the pull-up node PU.

The second reset sub-circuit 504 includes a ninth transistor M9. A gate of the ninth transistor M9 is coupled to a second reset signal terminal RESET2 that is configured to transmit the second reset signal Reset2, a first electrode of the ninth transistor M9 is coupled to the second voltage terminal VGL2, and a second electrode of the ninth transistor M9 is coupled to the pull-up node PU. The ninth transistor M9 is configured to be turned on under the control of the second reset signal Reset2, and transmit the received second voltage signal Vgl2 to the pull-up node PU.

In the related art, a GOA circuit generally includes a plurality of shift registers RS coupled in cascade. A cascade manner of the plurality of shift registers RS is generally as follows: except for a first-stage and a last-stage shift register RS, an output signal Output of a present-stage shift register RS is set as a reset signal Reset of a previous-stage shift register RS and an input signal Input of a next-stage shift register RS. In this way, a part of the output signal Output from the output signal terminal OUTPUT of the present-stage shift register RS is used by the previous-stage shift register RS and the next-stage shift register RS. Moreover, the output signal terminal OUTPUT of the present-stage shift register RS is configured to be coupled to a corresponding gate line, and the gate line is a load of a corresponding output signal terminal OUTPUT. As a result, the output signal Output (i.e., a scanning signal from the corresponding gate line) from the output signal terminal OUTPUT may not be a standard square wave. Therefore, the reset signal Reset and the input signal Input respectively received by shift registers cascaded with the present-stage shift register RS (i.e., the previous-stage shift register RS and the next-stage shift register RS) are not standard square waves. Consequently, an output signal Output transmitted by a corresponding output terminal OUTPUT of the present-stage shift register RS may not be able to effectively reset the previous-stage shift register RS, and may not be able to effectively turn on the next-stage shift register RS.

Based on this, in some embodiments, as shown in FIGS. 2, 4 and 5, the shift register RS further includes a cascade output circuit 11, a cascade pull-down circuit 12, and a cascade signal output terminal OUTPUT'.

The cascade output circuit 11 is coupled to the pull-up node PU and the cascade signal output terminal OUTPUT', and is configured to output a cascade signal to the cascade signal output terminal OUTPUT' under the control of a potential of the pull-up node PU. Herein, the cascade signal is used as a first reset signal Reset1 supplied to the previous-stage shift register RS of the present-stage shift register, and is also used as an input signal Input supplied to the next-stage shift register RS of the present-stage shift register.

The cascade pull-down circuit 12 is coupled to the pull-down node PD and the cascade signal output terminal OUTPUT', and is configured to reset the cascade signal output terminal OUTPUT' under the control of the potential of the pull-down node PD.

In this way, adjacent two stages of shift registers RS are cascaded through the cascaded signal output terminal OUTPUT' instead of the output signal terminal (such as OUTPUT1 or OUTPUT2) coupled to the gate line. Thus, the gate line will not become a load of the cascade output signal terminal OUTPUT'. In this way, it may be ensured that the cascade signal transmitted by the cascade signal output terminal OUTPUT' is a standard square wave. That is, the reset signal Reset and the input signal Input respectively received by the previous-stage shift register RS and the next-stage shift register RS cascaded with the present-stage shift register RS are standard square waves. Therefore, it is ensured that the cascade signal transmitted by the cascade signal output terminal OUTPUT' effectively resets the previous-stage shift register RS, and effectively turns on the next-stage shift register RS.

The cascade output circuit 11 includes at least one transistor. A gate of one transistor of the at least one transistor (for example, a fourteenth transistor M14 shown in FIGS. 3 and 4) is coupled to the pull-up node PU, a first electrode of the transistor is coupled to a sixth clock signal terminal CLKF that is configured to transmit a sixth clock signal Clkf, and a second electrode of the transistor is coupled to the cascade signal output terminal OUTPUT'. The transistor is configured to transmit the received sixth clock signal Clkf to the cascade signal output terminal OUTPUT' under the control of the potential of the pull-up node PU.

Of course, the cascade output circuit 11 may also include a plurality of transistors (for example, two transistors). A gate of each transistor is coupled to the pull-up node PU, a first electrode of each transistor is coupled to a same corresponding clock signal terminal, and a second electrode of each transistor is coupled to the cascade signal output terminal OUTPUT'. In this way, in a case where one transistor fails, the remaining transistor(s) may still be turned on under the control of the potential of the pull-up node PU, and transmit a clock signal from a clock signal terminal that is coupled to the remaining transistor(s) to a corresponding cascade output signal terminal OUTPUT' that is couple to the remaining transistor(s).

The cascade pull-down circuit 12 includes at least one transistor. A gate of one transistor of the at least one transistor (for example, a fifteenth transistor M15 shown in FIGS. 3 and 4) is coupled to the pull-down node PD, a first electrode of the transistor is coupled to a second voltage terminal VGL2 that is configured to transmit a second voltage signal Vgl2, and a second electrode of the transistor is coupled to the cascade signal output terminal OUTPUT'. The transistor is configured to transmit the received second voltage signal Vgl2 to the cascade signal output terminal OUTPUT' under the control of the potential of the pull-down node PD, so as to reset the cascade signal output terminal OUTPUT'.

Of course, the cascade pull-down circuit 12 may also include a plurality of transistors (for example, two transistors). A gate of each transistor is coupled to the pull-down node PD, a first electrode of each transistor is coupled to the second voltage terminal VGL2, and a second electrode of each transistor is coupled to the cascade signal output terminal OUTPUT'. In this way, in a case where one transistor fails, the remaining transistor(s) may still be turned on under the control of the potential of the pull-down node PD, and transmit a second voltage signal Vgl2 from the second voltage signal VGL2 that is coupled to the remaining transistor(s) to the cascade signal output terminal OUTPUT that is coupled to the remaining transistor(s), so as to reset the cascade signal output terminal OUTPUT'.

Some embodiments of the present disclosure do not limit a number of the at least two output circuits 10, a number of the at least two pull-down circuits 20, and a number of at least two output signal terminals OUTPUT in the shift register RS.

In some embodiments, as shown in FIGS. 1 to 5, the shift register RS includes two output circuits 10: a first output circuit 101 and a second output circuit 102, respectively. The shift register further includes two pull-down circuits 20: a first pull-down circuit 201 and a second pull-down circuit 202, respectively. The shift register further includes two output signal terminals include a first output signal terminal OUTPUT1 and a second output signal terminal OUTPUT2, respectively.

The first output circuit 101 and the first pull-down circuit 201 are respectively coupled to the first output signal terminal OUTPUT1, and the second output circuit 201 and the second pull-down circuit 202 are respectively coupled to the second output signal terminal OUTPUT2.

Based on this, the first output circuit 101 is configured to output a first scanning signal to the first output signal terminal OUTPUT1 under the control of the potential of the pull-up node PU; and the second output circuit 102 is configured to output a second scanning signal to the second output signal terminal OUTPUT2 under the control of the potential of the pull-up node PU. The first pull-down circuit 201 is configured to output a third voltage signal Vgl3 to the first output signal terminal OUTPUT1 under the control of the potential of the pull-down node PD; and the second pull-down circuit 202 is configured to output the third voltage signal Vgl3 to the second output signal terminal OUTPUT2 under the control of the potential of the pull-down node PD.

A specific structure of the shift register RS is described below by taking an example in which the shift register RS includes two output circuits 10, two pull-down circuits 20, and two output signal terminals OUTPUT.

In a case where the adjacent two stages of shift registers RS are cascaded through a corresponding output signal terminal OUTPUT, as shown in FIG. 3, in each stage of shift register RS, the pull-up control circuit 30 includes a first transistor M1, a second transistor M2, a third transistor M3, a first capacitor C1, and a second capacitor C2.

A gate of the first transistor M1 is coupled to an input signal terminal INPUT that is configured to transmit an input signal Input, a first electrode of the first transistor M1 is coupled to a first voltage terminal VDD that is configured to transmit a first voltage signal Vdd, and a second electrode of the first transistor M1 is coupled to the pull-up node PU. The first transistor is configured to be turned on under the control of the input signal Input, and transmit the received first voltage signal Vdd to the pull-up node PU.

A gate of the second transistor M2 is coupled to the pull-down node PD, a first electrode of the second transistor M2 is coupled to a second voltage terminal VGL2 that is configured to transmit a second voltage signal Vgl2, and a second electrode of the second transistor M2 is coupled to the pull-up node PU. The second transistor M2 is configured to be turned on under the control of the potential of the pull-down node PD, and transmit the received second voltage signal Vgl2 to the pull-up node PU.

A gate of the third transistor M3 is coupled to a first reset signal terminal RESET1 that is configured to transmit a first reset signal Reset1, a first electrode of the third transistor M3 is coupled to the second voltage terminal VGL2, and a second electrode of the third transistor M3 is coupled to the pull-up node PU. The third transistor M3 is configured to be turned on under the control of the first reset signal Reset1, and transmit the received second voltage signal Vgl2 to the pull-up node PU, so as to reset the shift register RS.

One end of the first capacitor C1 is coupled to the pull-up node PU, and another end of the first capacitor C1 is coupled to the first output signal terminal OUTPUT1.

One end of the second capacitor C2 is coupled to the pull-up node PU, and another end of the second capacitor C2 is coupled to the second output signal terminal OUTPUT2.

The pull-down control circuit 40 includes a fourth transistor M4 and a fifth transistor M5.

A gate and a first electrode of the fourth transistor M4 are respectively coupled to a first control signal terminal CLK1 that is configured to transmit a first control signal Clk1, and a second electrode of the fourth transistor M4 is coupled to the pull-down node PD. The fourth transistor M4 is configured to be turned on under the control of the first control signal Clk1, and transmit the received first control signal Clk1 to the pull-down node PD.

A gate of the fifth transistor M5 is coupled to the pull-up node PU, a first electrode of the fifth transistor M5 is coupled to a second voltage terminal VGL2, and a second electrode of the fifth transistor M5 is coupled to the pull-down node PD. The fifth transistor M5 is configured to be turned on under the control of the pull-up node PU, and transmit the received second voltage signal Vgl2 to the pull-up node PD.

In some embodiments, the shift register RS further includes a detection control circuit 50, and the detection control circuit 50 includes a sixth transistor M6, a fourth capacitor C4, a seventh transistor M7, an eighth transistor M8, a ninth transistor M9, and a first node N1.

A gate of the sixth transistor M6 is coupled to a second clock signal terminal CLKB that is configured to transmit a second clock signal Clkb, a first electrode of the sixth transistor M6 is coupled to the input signal terminal INPUT, and a second electrode of the sixth transistor M6 is coupled to the first node N1. The sixth transistor M6 is configured to be turned on under the control of the second clock signal Clkb, and transmit the received input signal to the first node N1.

One end of the fourth capacitor C4 is coupled to the first node N1, and another end of the fourth capacitor C4 is coupled to the second voltage terminal VGL2.

A gate of the seventh transistor M7 is coupled to the first node N1, a first electrode of the seventh transistor M7 is coupled to a third clock signal terminal CLKC that is configured to transmit a third clock signal Clkc, and a second electrode of the seventh transistor M7 is coupled to a first electrode of the eighth transistor M8. A gate of the eighth transistor M8 is coupled to a first clock signal terminal CLKA that is configured to transmit a first clock signal Clka, and a second electrode of the eighth transistor M8 is coupled to the pull-up node PU. The seventh transistor M7 is configured to be turned on under the control of the potential of the first node N1, and transmit the received third clock signal Clkc to the eighth transistor M8; and the eighth transistor M8 is configured to be turned on under the control of the first clock signal Clka, and transmit the received third clock signal Clkc to the pull-up node PU.

A gate of the ninth transistor M9 is coupled to a second reset signal terminal RESET2 that is configured to transmit a second reset signal Reset2, a first electrode of the ninth transistor M9 is coupled to the second voltage terminal VGL2, and a second electrode of the ninth transistor M9 is coupled to the pull-up node PU. The ninth transistor M9 is configured to be turned on under the control of the second reset signal Reset2, and transmit the received second voltage signal Vgl2 to the pull-up node PU, so as to reset the shift register RS.

The first output circuit 101 includes a tenth transistor M10. A gate of the tenth transistor M10 is coupled to the pull-up node PU, a first electrode of the tenth transistor M10 is coupled to a fourth clock signal terminal CLKD that is configured to transmit a fourth clock signal Clkd, and a second electrode of the tenth transistor M10 is coupled to the first output signal terminal OUTPUT1. The tenth transistor M10 is configured to be turned on under the control of the potential of the pull-up node PU, and transmit the received fourth clock signal Clkd to the first output signal terminal OUTPUT1.

The second output-circuit 102 includes an eleventh transistor M11. A gate of the eleventh transistor M11 is coupled to the pull-up node PU, a first electrode of the eleventh transistor M11 is coupled to a fifth clock signal terminal CLKE that is configured to transmit a fifth clock signal Clke, and a second electrode of the eleventh transistor M11 is coupled to the second output signal terminal OUTPUT2. The eleventh transistor M11 is configured to be turned on under the control of the potential of the pull-up node PU, and transmit the received fifth clock signal Clke to the second output signal terminal OUTPUT2.

The first pull-down circuit 201 includes a twelfth transistor M12. A gate of the twelfth transistor M12 is coupled to the pull-down node PD, a first electrode of the twelfth transistor M12 is coupled to a third voltage terminal VGL3 that is configured to transmit a third voltage signal Vgl3, and a second electrode of the twelfth transistor M12 is coupled to the first output signal terminal OUTPUT1. The twelfth transistor M12 is configured to be turned on under the control of the pull-down node PD, and transmit the received third voltage signal Vgl3 to the first output signal terminal OUTPUT1.

The second pull-down circuit 202 includes a thirteenth transistor M13. A gate of the thirteenth transistor M13 is coupled to the pull-down node PD, a first electrode of the thirteenth transistor M13 is coupled to the third voltage terminal VGL3, and a second electrode of the thirteenth transistor M13 is coupled to the second output signal terminal OUTPUT2. The thirteenth transistor M13 is configured to be turned on under the control of the pull-down node PD, and transmit the received third voltage signal Vgl3 to the second output signal terminal OUTPUT2.

In a case where adjacent two stages of shift registers are cascaded through a cascade signal output terminal OUTPUT' that is configured to transmit a cascade signal Output', as shown in FIG. 4, in addition to the pull-up control circuit 30, the pull-down control circuit 40, the detection control circuit 50, the first output circuit 101, the second output circuit 102, the first pull-down circuit 201, and the second pull-down circuit 202, each stage of shift register RS further includes a cascade output circuit 11, a cascade pull-down circuit 12, and a cascade signal output terminal OUTPUT'.

The cascade output circuit 11 includes a fourteenth transistor M14. A gate of the fourteenth transistor M14 is coupled to the pull-up node PU, a first electrode of the fourteenth transistor M14 is coupled to a sixth clock signal terminal CLKF that is configured to transmit a sixth clock signal Clkf, and a second electrode of the fourteenth transistor M14 is coupled to the cascade signal output terminal OUTPUT'. The fourteenth transistor M14 is configured to be turned on under the control of the potential of the pull-up node PU, and transmit the received sixth clock signal Clkf to the cascade signal output terminal OUTPUT'.

The cascade pull-down circuit 12 includes a fifteenth transistor M15. A gate of the fifteenth transistor M15 is coupled to the pull-down node PD, a first electrode of the fifteenth transistor M15 is coupled to the second voltage terminal VGL2, and a second electrode of the fifteenth transistor M15 is coupled to the cascade signal output terminal OUTPUT'. The fifteenth transistor M15 is configured to be turned on under the control of the potential of the pull-down node PD, and transmit the received second voltage signal Vgl2 to the cascade signal output terminal OUTPUT'.

Moreover, in the shift register RS shown in FIG. 4, the pull-up control circuit 30 includes a first transistor M1, a second transistor M2, a third transistor M3, and a third capacitor C3. As for arrangement manners of the first transistor M1, the second transistor M2, and the third transistor M3, reference may be made to FIG. 3. The third capacitor C3 is arranged in such a manner that one end of the third capacitor C3 is coupled to the pull-up node PU, and another end of the third capacitor C3 is coupled to the cascade signal output terminal OUTPUT'.

In addition, in the shift register RS shown in FIG. 4, as for specific structures of the pull-down control circuit 40, the detection control circuit 50, the first output circuit 101, the second output circuit 102, the first pull-down circuit 201, and the second pull-down circuit 202, reference may be made to structure of corresponding elements in the shift register RS shown in FIG. 3, and details are not described herein again.

In some other embodiments, the number of output circuits 10 in the shift register RS is greater than 2, the number of output signal terminals OUTPUT in the shift register RS is greater than 2, and the number of pull-down circuits 20 in the shift register RS is greater than 2. For example, the number of output circuits 10, the number of output signal terminals OUTPUT, and the number of pull-down circuits 20 are all 3.

A plurality of output circuits 10 and a plurality of output signal terminals OUTPUT are coupled to each other in one-to-one correspondence; and a plurality of pull-down circuits 20 and a plurality of output signal terminals OUTPUT are coupled to each in one-to-one correspondence.

It will be understood that, since one end of each of the at least two capacitors C included in the first energy storage sub-circuit 304 is coupled to the pull-up node PU, and another end of each of the at least two capacitors C is coupled to a corresponding one of the at least two output signal terminals OUTPUT, in a case where the number of output signal terminals OUTPUT is 3, a number of capacitors C in the first energy storage sub-circuit 304 is also 3; one end of each of the three capacitors C is coupled to the pull-up node PU, and another end of each of the three capacitors C is coupled to a corresponding one of the three output signal terminals OUTPUT.

It will be noted that, in some embodiments, the plurality of transistors included in the shift register RS provided by some embodiments are all N-type transistors. In this case, the first voltage signal Vdd is a high level voltage signal, the second voltage signal Vgl2 is a low level voltage signal, and the third voltage signal Vgl3 is a low level voltage signal.

For example, a voltage value of the second voltage signal Vgl2 is less than or equal to a voltage value of the third voltage signal Vgl3. Therefore, when the second voltage terminal VGL2 transmits the second voltage signal Vgl2 to the pull-down node PD through transistor(s), the pull-down node PD is at a low level, a voltage at a gate of each transistor in each pull-down circuit 20 is equal to a voltage Vgl2 of the second voltage terminal VGL2, and a voltage at a first electrode of each transistor in each pull-down circuit 20 is the Vgl3. Since the voltage value of the second voltage signal Vgl2 is less than or equal to the voltage value of the third voltage signal Vgl3, a voltage difference between the gate and the first electrode of the transistor is less than or equal to 0, thereby preventing the transistor from being turned on. Therefore, the problem of leakage current in the transistor(s) of each pull-down circuit 20 when a signal transmitted by the output signal terminal OUTPUT is a high level is prevented.

In some other embodiments, the plurality of transistors included in the shift register RS provided by some embodiments are all P-type transistors; the second voltage signal Vgl2 and the third voltage signal Vgl3 are both low level voltage signals, and the voltage value of the second voltage signal Vgl2 is greater than or equal to the voltage value of the third voltage signal Vgl3. Therefore, when the second voltage terminal VGL2 transmits the second voltage signal Vgl2 to the pull-down node PD through transistor(s), the pull-down node PD is at a low level, the voltage at the gate of each transistor in each pull-down circuit 20 is equal to the voltage Vgl2 of the second voltage terminal VGL2, and the voltage at the first electrode of each transistor in each pull-down circuit 20 is the Vgl3. Since the voltage value of the second voltage signal Vgl2 is greater than or equal to the voltage value of the third voltage signal Vgl3, a voltage difference between the gate and the first electrode of the transistor is greater than or equal to 0, thereby preventing the transistor from being turned on. Therefore, the problem of leakage current in the transistor(s) of each pull-down circuit 20 when the signal transmitted by the output signal terminal OUTPUT is a high level is prevented.

In some examples, the second voltage terminal VGL2 and the third voltage terminal VGL3 is a same voltage terminal. Therefore, when the second voltage terminal VGL2 transmits the second voltage signal Vgl2 to the pull-down node PD through transistor(s), the pull-down node PD is at a low level, the voltage at the gate of each transistor in each pull-down circuit 20 is equal to the voltage Vgl2 of the second voltage terminal VGL2, and the voltage at the first electrode of each transistor in each pull-down circuit 20 is the Vgl3. In this case, the voltage difference between the gate and the first electrode of the transistor is equal to 0, thereby preventing the transistor from being turned on, and preventing the problem of leakage current in the transistor(s) of the pull-down circuit 20.

In some examples, in the shift register RS, any one of the at least two capacitors C (e.g., the first capacitor C1 and the second capacitor C2), the third capacitor C3, and the fourth capacitor C4 included in the pull-up control circuit 30 is a capacitor provided by a parasitic capacitance between elements in a corresponding circuit. In some other examples, any one of the at least two capacitors C (e.g., the first capacitor C1 and the second capacitor C2), the third capacitor C3, and the fourth capacitor C4 included in the pull-up control circuit 30 is an external capacitor separately provided in the corresponding circuit, which are not specifically limited by some embodiments of the present disclosure.

In some embodiments, the display device includes a plurality of sub-pixels arranged in an array, and a plurality of gate lines, each of which extending in a direction parallel to (or approximately parallel to) a row direction. Each row of sub-pixels corresponds to two different gate lines, and the two gate lines are loaded with different signals. For example, one gate line is configured to be input with a pixel data, and another gate line is configured to be input with a compensation data. Two output signal terminals OUTPUT are configured to be provided for each shift register in the gate driving circuit, so as to respectively transmit different scanning signals to the two gate lines corresponding to the same row of sub-pixels.

Based on this, as shown in FIG. 5, the shift register RS further includes at least two additional output circuits 10', at least two additional pull-down circuits 20', and at least two additional output signal terminals OUTPUT".

The at least two additional output circuits 10' are coupled to the pull-up node PU, and the at least two additional pull-down circuits 20' are coupled to the pull-down node PD. Each of the at least two additional output circuits 10' is coupled to a corresponding one of the at least two additional output signal terminals OUTPUT", and each of the at least two additional pull-down circuits 20' is coupled to a corresponding one of the at least two additional output signal terminals OUTPUT".

Each of the at least two additional output signal terminals OUTPUT" is coupled to a corresponding one of the at least two gate lines; the at least two additional output signal terminals OUTPUT" are in one-to-one correspondence with the at least two output signal terminals OUTPUT; and a gate line to which each additional output signal terminal OUTPUT" is coupled and a gate line to which a corresponding output signal terminal OUTPUT is coupled are configured to drive a same row of sub-pixels.

Each of the at least two additional output circuits 10' is configured to output an additional scanning signal to a corresponding additional output signal terminal OUTPUT" under the control of the first voltage signal Vdd at the pull-up node PU.

Each of the at least two additional pull-down circuits 20' is configured to reset a corresponding additional output signal terminal OUTPUT" under the control of the first control signal Clk1 at the pull-down node PD.

In this way, each of the at least two output circuits 10 may transmit a scanning signal to a corresponding output signal terminal OUTPUT according to a timing under the control of the potential of the pull-up node PU, and an additional output circuit 10' corresponding to the each of the at least two output circuit 10 may output an additional scanning signal to a corresponding additional output signal terminal OUTPUT" according to the timing under the control of the potential of the pull-up node PU, so that in the shift register RS, each output signal terminal OUTPUT and an additional output signal terminal OUTPUT" corresponding to the output signal terminal OUTPUT respectively transmit corresponding signals to two gate lines corresponding to a same row of sub-pixels that are coupled to the two output signal terminals, so as to scan the two gate lines corresponding to the row of sub-pixels.

In some embodiments, as shown in FIG. 5, the at least two additional output circuits 10' include a first additional output circuit 101' and a second additional output circuit 102'. The at least two additional pull-down circuits 20' include a first additional pull-down circuit 201' and a second additional pull-down circuit 202'. The at least two additional output signal terminals OUTPUT" include a first additional output signal terminal OUTPUT1" and a second additional output signal terminal OUTPUT2". The first additional output circuit 101' and the first additional pull-down circuit 201' are respectively coupled to the first additional output signal terminal OUTPUT1 ", and the second additional output circuit 102' and the second additional pull-down circuit 202' are respectively coupled to the second additional output signal terminal OUTPUT2".

In this way, the first output circuit 101 and the first additional output circuit 101' respectively transmit signals to the first output signal terminal OUTPUT1 and the first additional output signal terminal OUTPUT1" according to the timing under the control of the potential of the pull-up node PU, and the first output signal terminal OUTPUT1 and the first additional output signal terminal OUTPUT1" respectively transmit corresponding output signals to two gate lines corresponding to a same row of sub-pixels that are coupled to the two output signal terminals, so as to scan the two gate lines corresponding to the row of sub-pixels. The second output circuit 102 and the second additional output circuit 102' respectively transmit signals to the second output signal terminal OUTPUT2 and the second additional output signal terminal OUTPUT2" according to the timing under the control of the potential of the pull-up node PU, and second first output signal terminal OUTPUT2 and the second additional output signal terminal OUTPUT2" respectively transmit corresponding output signals to two gate lines corresponding to a same row of sub-pixels that are coupled to the two output signal terminals, so as to scan the two gate lines corresponding to the row of sub-pixels.

It will be understood that, since the additional output circuit 10', the additional pull-down circuit 20', and the additional output signal terminal OUTPUT" are set for a case where a same row of sub-pixels in the display device correspond to two different gate lines, respective numbers of the additional output circuits 10', the additional pull-down circuits 20', and the additional output signal terminals OUTPUT" correspond to the number of the output circuits 10. That is, in a case where the shift register RS includes three output circuits 10 and two gate lines are set for a same row of sub-pixels in the display device, the shift register RS includes three additional output circuits 10', three additional pull-down circuits 20', and three additional output signal terminals OUTPUT". As for specific structure of the shift register, reference may be made to the above embodiments, and details are not described herein again.

For example, as shown in FIG. 5, the first additional output circuit 101' includes a sixteenth transistor M16. A gate of the sixteenth transistor M16 is coupled to the pull-up node PU, a first electrode of the sixteenth transistor M16 is coupled to a seventh clock signal terminal CLKG that is configured to transmit a seventh clock signal Clkg, and a second electrode of the sixteenth transistor M16 is coupled to the first additional output signal terminal OUTPUT1". The sixteenth transistor M16 is configured to be turned on under the control of the potential of the pull-up node PU, and transmit the received seventh clock signal Clkg to the first additional output signal terminal OUTPUT1".

The second additional output circuit 102' includes a seventeenth transistor M17. A gate of the seventeenth transistor M17 is coupled to the pull-up node PU, a first electrode of the seventeenth transistor M17 is coupled to an eighth clock signal terminal CLKH that is configured to transmit an eighth clock signal Clkh, and a second electrode of the seventeenth transistor M17 is coupled to the second additional output signal terminal OUTPUT2". The seventeenth transistor M17 is configured to turned on under the control of the potential of the pull-up node PU, and transmit the received eighth clock signal Clkh to the second additional output signal terminal OUTPUT2".

The first additional pull-down circuit 201' includes an eighteenth transistor M18. A gate of the eighteenth transistor M18 is coupled to the pull-down node PD, a first electrode of the eighteenth transistor M18 is coupled to a third voltage terminal VGL3 that is configured to transmit a third voltage signal Vgl3, and a second electrode of the eighteenth transistor M18 is coupled to the first additional output signal terminal OUTPUT1". The eighteenth transistor M18 is configured to be turned on under the control of the potential of the pull-down node PD, and transmit the received third voltage signal Vgl3 to the first additional output signal terminal OUTPUT1", so as to reset the first additional output signal terminal OUTPUT1".

The second additional pull-down circuit 202' includes a nineteenth transistor M19. A gate of the nineteenth transistor M19 is coupled to the pull-down node PD, a first electrode of the nineteenth transistor M19 is coupled to the third voltage terminal VGL3, and a second electrode of the nineteenth transistor M19 is coupled to the second additional output signal terminal OUTPUT2". The nineteenth transistor M19 is configured to be turned on under the control of the potential of the pull-down node PD, and transmit the received third voltage signal Vgl3 to the second additional output signal terminal OUTPUT2", so as to reset the first additional output signal terminal OUTPUT2".

Figure 6:
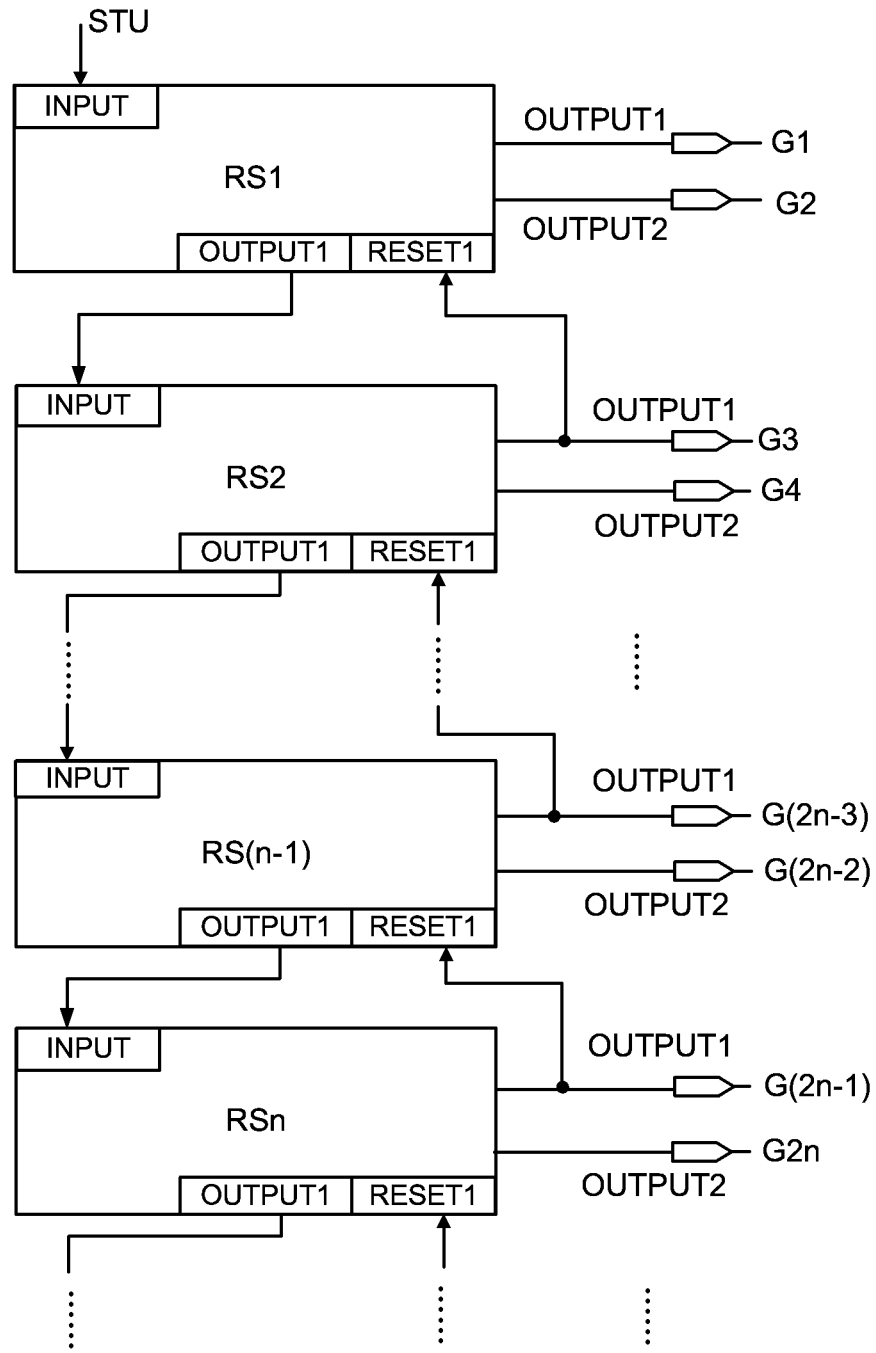
FIG. 6 is a schematic diagram showing a gate driving circuit including a plurality of cascaded shift registers, in accordance with some embodiments.
Figure 7:
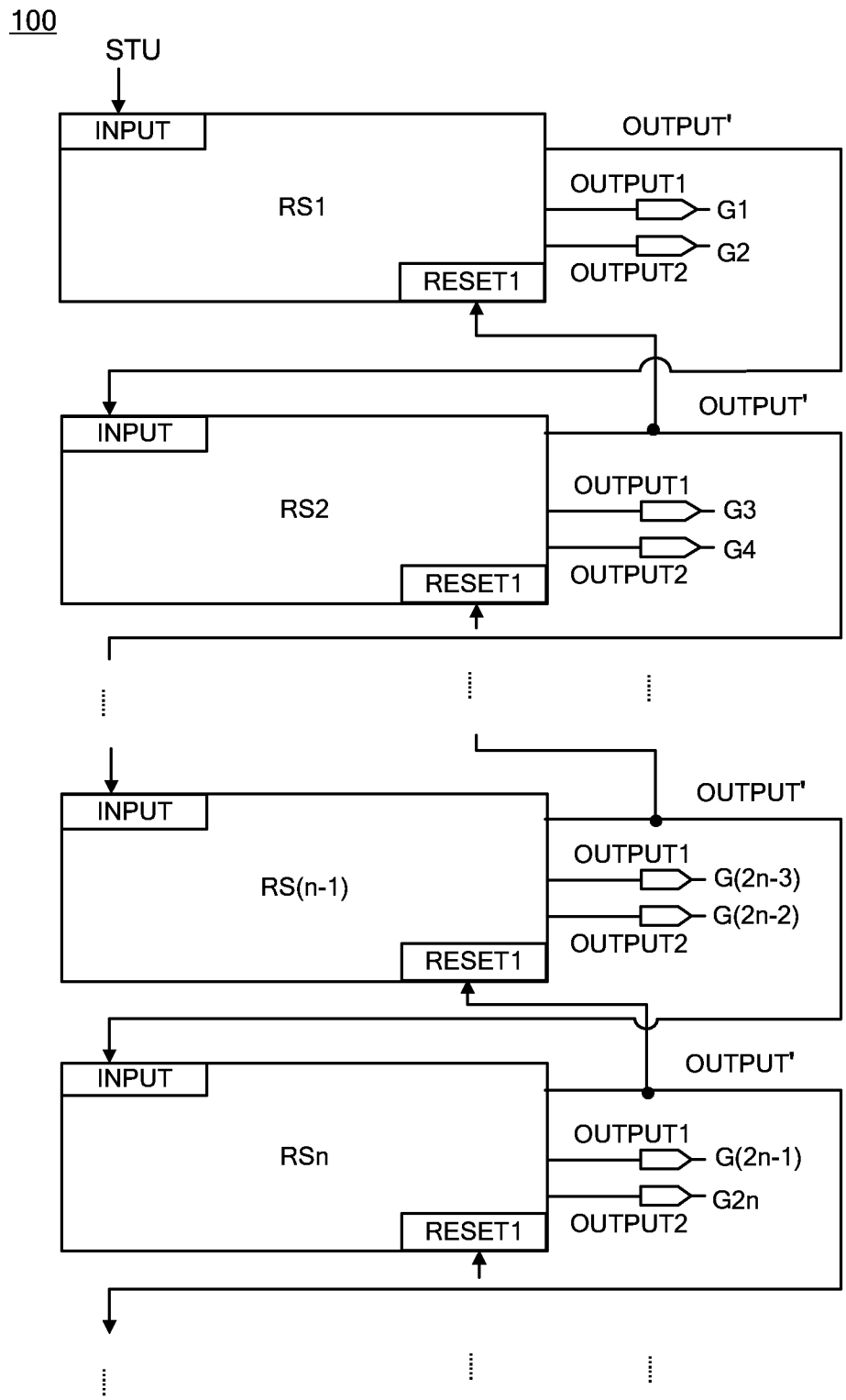
FIG. 7 is a schematic diagram showing another gate driving circuit including a plurality of cascaded shift registers, in accordance with some embodiments.

Some embodiments of the present disclosure further provide a gate driving circuit 100. As shown in FIGS. 6 and 7, the gate driving circuit 100 includes at least two shift registers RS coupled in cascade, and each shift register RS is the shift register RS described as described in any of the above embodiments.

Based on this, since each shift register RS includes at least two output signal terminals OUTPUT, in this manner, it may be possible to reduce the number of shift registers RS in the gate driving circuit 100 while ensuring that the number of output signal terminals OUTPUT is the same. In this way, while ensuring that the gate driving circuit 100 outputs scanning signals to a plurality of gate lines row by row, it may be possible to simplify the overall structure of the gate driving circuit 100, which is conducive for reducing a frame width of the display device including the gate driving circuit.

Figure 10:
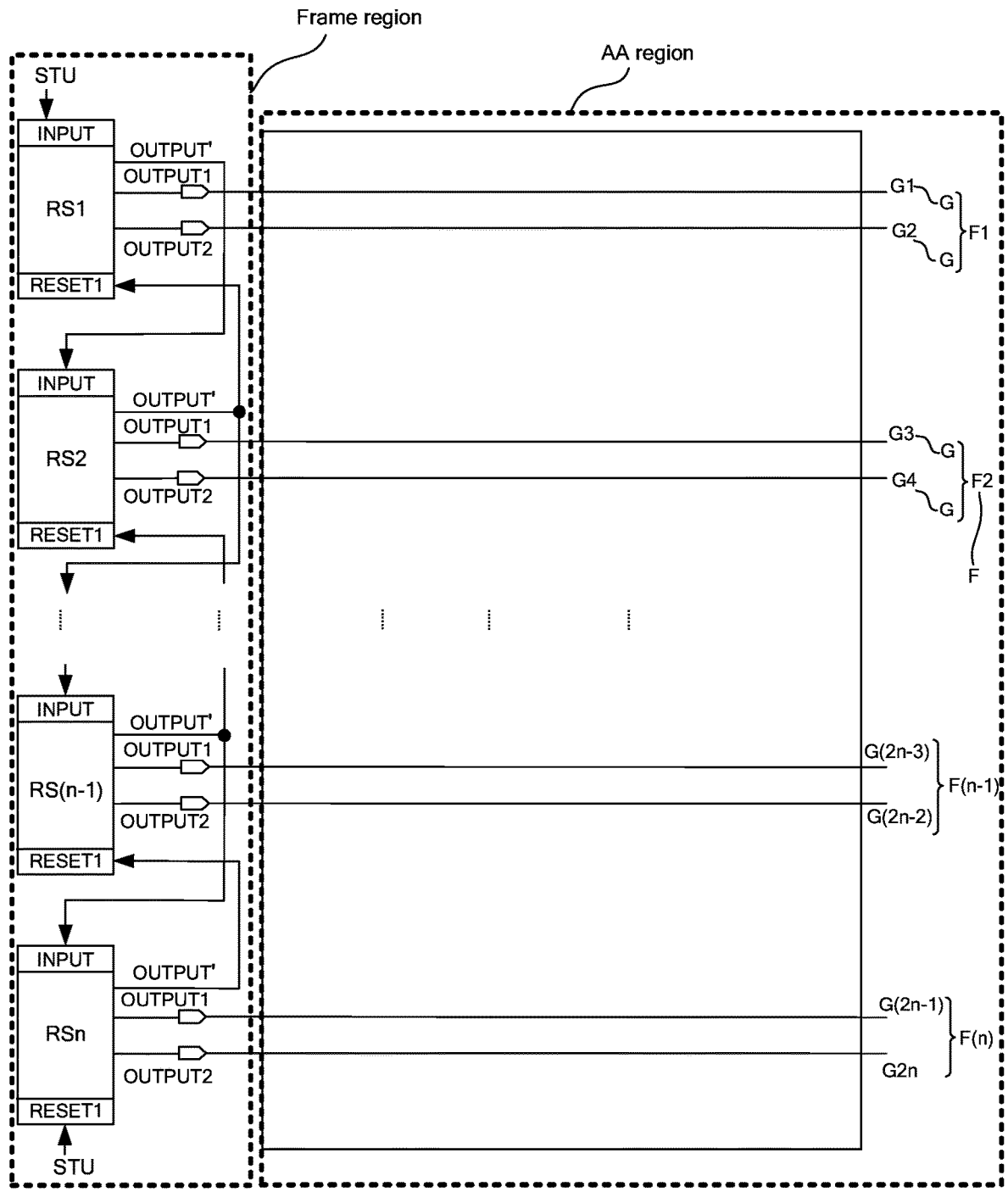
FIG. 10 is a schematic diagram of a display device, in accordance with some embodiments.

In some examples, as shown in FIGS. 6, 7, and 10, an input signal terminal INPUT of a first-stage shift register RS1 is coupled to a start signal terminal STU that is configured to transmit a start signal Stu. The start signal Stu received by the start signal terminal STU is a pulse signal provided by a power supply system in the display device, or is an output signal simulated by a dummy shift register in the display device. A waveform of the simulated output signal is the same as a waveform of a signal transmitted by the output signal terminal OUTPUT of the first-stage shift register RS1.

A first reset signal terminal RESET1 of a last-stage shift register is coupled to a termination signal terminal STD that is configured to transmit a termination signal Std. The termination signal Std received by the termination signal terminal STD is a pulse signal provided by the power supply system in the display device, or is an output signal simulated by the dummy shift register in the display device. A waveform of the simulated output signal is the same as a waveform of a signal transmitted by the output signal terminal OUTPUT of the last-stage shift register RS.

In some examples, the input signal terminal INPUT coupled to the detection control circuit 50 and the input signal terminal INPUT coupled to the pull-up control circuit 30 in the first-stage shift register RS1 are coupled to a same start signal terminal STU; in some other examples, the two input signal terminals INPUT are respectively coupled to different start signal terminals (for example, STU1 and STU2).

In some examples, as shown in FIG. 6, except for a last-stage shift register RS, one of the at least two output signal terminals OUTPUT of each of remaining stages of shift registers RS is coupled to an input signal terminal INPUT of a next-stage shift register RS. Except for a first-stage shift register RS, one of the at least two output signal terminals OUTPUT of each of remaining stages of shift registers RS is coupled to a first reset signal terminal RESET1 of a previous-stage shift register RS. A first reset signal terminal RESET1 of the last-stage shift register is coupled to a termination signal terminal STD that is configured to transmit a termination signal Std.

In this way, except for the first-stage shift register RS1 and the last-stage shift register RS, each of remaining stages of shift registers RS may be able to reset a previous-stage shift register RS and turn on a next-stage shift register RS through the output signal terminal OUTPUT of the stage of shift register RS, thereby realizing a row-by-row scanning of the gate lines in the display device.

In some other examples, as shown in FIG. 7, in a gate driving circuit, each stage of shift register RS includes a cascade signal output terminal OUTPUT'. An input signal terminal INPUT of a first-stage shift register RS is coupled to a start signal terminal STU that is configured to transmit a start signal Stu. Except for a last-stage shift register RS, a cascade signal output terminal OUTPUT' of each of remaining stages of shift registers RS is coupled to an input signal terminal INPUT of a next-stage shift register RS. Except for the first-stage shift register RS, a cascade signal output terminal OUTPUT' of each of remaining stages of shift registers RS is coupled to a first reset signal terminal RESET1 of a previous-stage shift register RS. A first reset signal terminal RESET1 of the last-stage shift register RS is coupled to a termination signal terminal STD that is configured to transmit a termination signal Std.

In this way, except for the first-stage shift register RS and the last-stage shift register RS, each of remaining stages of shift registers RS may be able to reset the previous-stage shift register and turn on the next-stage shift register RS through the cascade signal output terminal OUTPUT' of the stage of shift register RS. In this way, by ensuring that the cascade signal transmitted by the cascade signal output terminal OUTPUT' is a standard square wave, it may be possible to ensure that the reset signal Reset and the input signal Input respectively received by the previous-stage shift register and the next-stage shift register of the present-stage shift register RS are both standard square waves. Therefore, it may be possible to ensure that the cascade signal effectively resets the previous-stage shift register RS and effectively turns on the next-stage shift register RS.

In some embodiments, in a case where adjacent two stages of shift registers RS in the gate driving circuit 100 are cascaded through a cascade signal output terminal OUTPUT', each stage of shift register RS includes a sixth clock signal terminal CLKF. The gate driving circuit 100 further includes two sixth clock signal lines. A sixth clock signal terminal CLKF of a shift register RS in an odd-number-th stage is coupled to one sixth clock signal line of the two sixth clock signal lines. A sixth clock signal terminal CLKF of a shift register RS in an even-number-th stage is coupled to another sixth clock signal line of the two sixth clock signal lines.

Figure 8A:
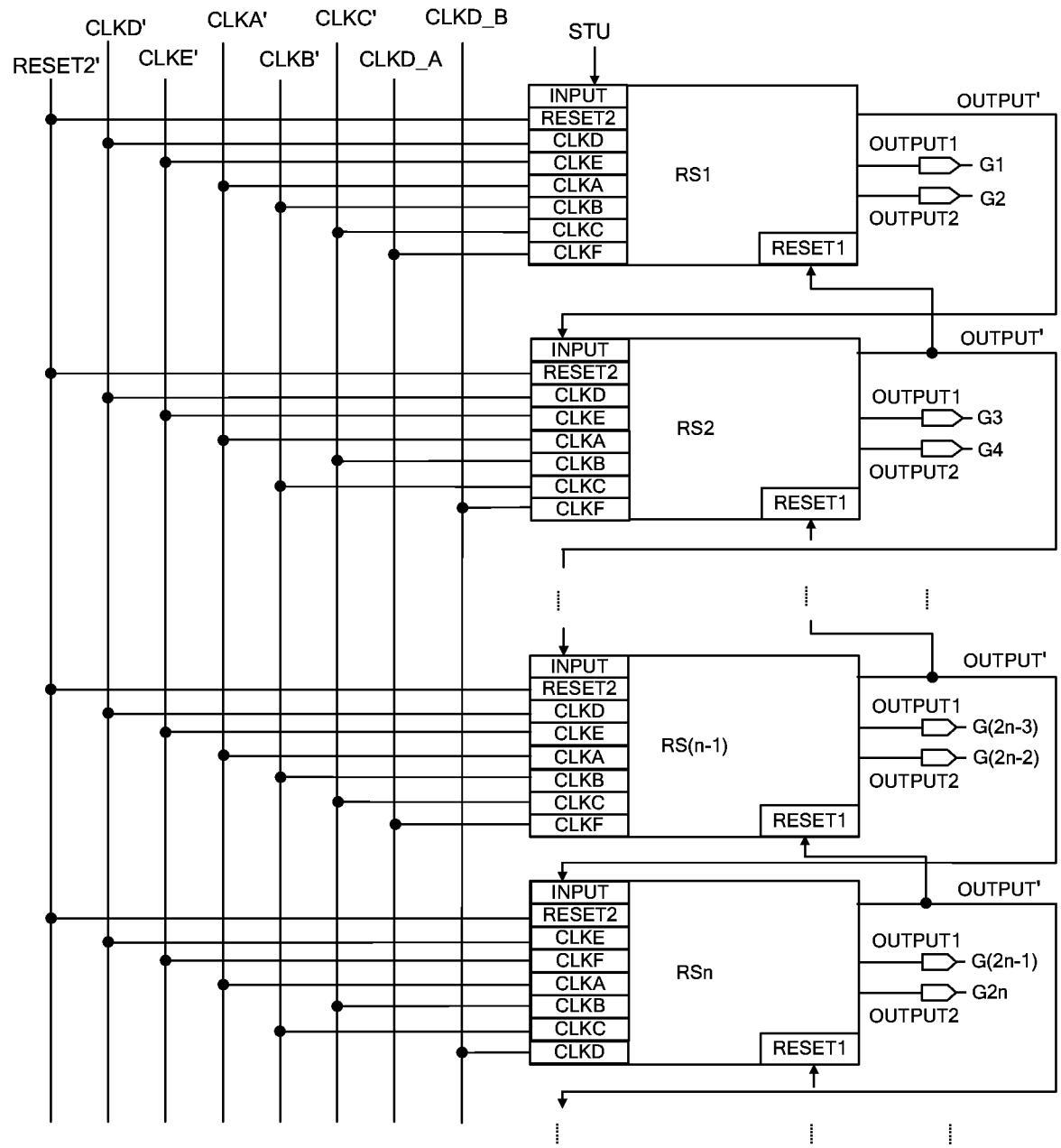
FIG. 8A is a schematic diagram showing yet another gate driving circuit including a plurality of cascaded shift registers, in accordance with some embodiments.
Figure 8B:
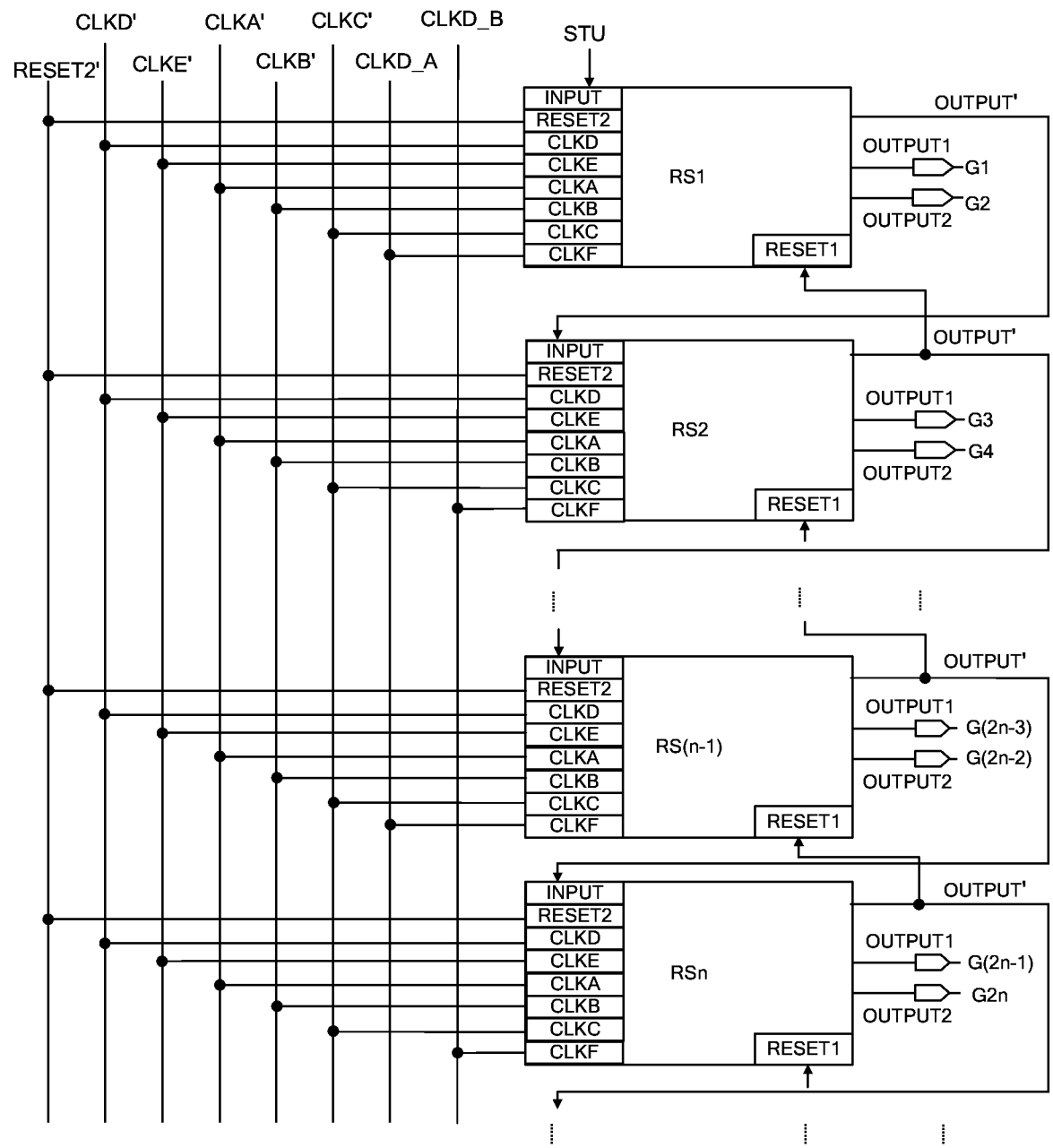
FIG. 8B is a schematic diagram showing yet another gate driving circuit including a plurality of cascaded shift registers, in accordance with some embodiments.

As shown in FIGS. 8A and 8B, the two sixth clock signal lines included in the gate driving circuit 100 are CKLD_A and CKLD_B, respectively. In the gate driving circuit, the sixth clock signal terminal CLKF of a shift register RS in an odd-number-th stage is coupled to one sixth clock signal line of the two sixth clock signal lines, for example, CKLD_A; and the sixth clock signal terminal CLKF of a shift register RS in an even-number-th stage is coupled to another sixth clock signal line of the two sixth clock signal lines, for example, CKLD_B, so that corresponding cascade signals are output to the signal output terminal OUTPUT of the next-stage shift register RS through different sixth clock signal lines (e.g., CKLD_A and CKLD_B), and it is ensured that scanning signals are output to each gate line row by row.

It will be noted that, in each stage of shift register RS in the gate driving circuit 100, connection manners of the second clock signal terminal CLKB and the third clock signal terminal CLKC may be set according to actual needs. Of course, when the connection manner is different, corresponding timing signals are also different.

In some embodiments, the second clock signal terminals CLKB and the third clock signal terminals CLKC of adjacent two stages of shift registers RS are alternately coupled to the second clock signal line CLKB' and the third clock signal line CLKC'. For example, as shown in FIG. 8A, the second clock signal terminal CLKB of a shift register RS in an odd-number-th stage is coupled to the second clock signal line CLKB', and the third clock signal terminal CLKC of this shift register RS in an odd-number-th stage is coupled to the third clock signal line CLKC'; the second clock signal terminal CLKB of a shift register RS in an even-number-th stage is coupled to the third clock signal line CLKC', and the third clock signal terminal CLKC of this shift register RS in an even-number-th stage is coupled to the second clock signal line CLKB'. As for control signals in the above connection mode, reference may be made to FIG. 8A and description in subsequent embodiments.

In some other embodiments, as shown in FIG. 8B, the second clock signal terminal CLKB of each stage of shift register RS is coupled to the second clock signal line CLKB', and the third clock signal terminal CLKC of each stage of shift register RS is coupled to the third clock signal line CLKC'. As for control signals in this connection mode, reference may be made to FIG. 8B and description in subsequent embodiments.

For example, connection manners of other signal terminals are as follows. As shown in FIGS. 8A and 8B, the second reset signal terminal RESET2 is coupled to a second reset signal line RESET2'; the fourth clock signal terminal CLKD is coupled to a fourth clock signal line CLKD'; the fifth clock signal terminal CLKE is coupled to a fifth clock signal line CLKE'; and the first clock signal terminal CLKA is coupled to the first clock signal line CLKA', in this way, each signal terminal receives a corresponding signal transmitted by a corresponding signal line.

As shown in FIG. 10, some embodiments of the present disclosure further provide a display device 1. The display device 1 includes the gate driving circuit 100 as described in the above embodiments, and a plurality of gate lines G. The plurality of gate lines G are configured to be divided into at least two gate line groups F, and each gate line group F includes at least two gate lines G that are arranged in sequence. The at least two stages of shift registers RS in the gate driving circuit 100 are in one-to-one correspondence with the at least two gate line groups F. Each of the at least two output signal terminals of each stage of shift register is coupled to a corresponding one of the at least two gate lines G of a corresponding gate line group F.

For example, the display device 1 has a display region (commonly known as an AA region) and a plurality of frame regions. The display device 1 includes 2n gate lines disposed in the display region, and a gate driving circuit 100 disposed in a frame region; n is a positive integer greater than 1.

The 2n gate lines are configured to be divided into n gate line groups, respectively: a first gate line group F1 to an nth gate line group Fn. Each gate line group F includes two adjacent gate lines G. For example, the first gate line group F1 includes a first gate line G1 and a second gate line G2, and a second gate line group F2 includes a third gate line G3 and a fourth gate line G4, . . . , an (n−1)th gate line group F(n−1) includes a (2n−3)th gate line G(2n−3) and a (2n−2)th gate line G(2n−2), and the nth gate line group Fn includes a (2n−1)th gate line G (2n−1) and a 2n-th gate line G2n.

The gate driving circuit 100 includes n stages of shift registers, respectively: a first-stage shift register RS1 to an nth-stage shift register RSn, which are in one-to-one correspondence with the n gate line groups. That is, the first-stage shift register RS1 corresponds to the first gate line group F1, a second-stage shift register RS2 corresponds to the second gate line group F2, . . . , an (n−1)th-stage shift register RS(n−1) corresponds to the (n−1)th gate line group F(n−1), and the nth-stage shift register RSn corresponds to the nth gate line group Fn.

Each stage of shift register includes two output signal terminals, respectively: a first output signal terminal OUTPUT1 and a second output signal terminal OUTPUT2. The first output signal terminal OUTPUT1 of each stage of shift register is coupled to one gate line of a corresponding gate line group, and the second output signal terminal OUTPUT2 of each stage of shift register is coupled to another gate line of the corresponding gate line group. For example, the first output signal terminal OUTPUT1 of the first-stage shift register RS1 is coupled to the first gate line G1 of the first gate line group F1, and the second output signal terminal OUTPUT2 of the first-stage shift register RS1 is coupled to the second gate line G2 of the first gate line group F1.

In some examples, the display device 1 further includes another gate driving circuit 100, a driving mode of the display device 1 is double-sided driving. That is, a number of gate driving circuits included in the display device 1 is two, one gate driving circuit 100 is disposed in a frame region on one side of the display region of the display device 1, and another gate driving circuit 100 is disposed in a frame region on an opposite side of the display region. For example, the gate driving circuit 100 disposed on one side is configured to drive sub-pixels in odd-number-th rows, and the gate driving circuit 100 disposed on another side is configured to drive sub-pixels in even-number-th rows.

In some embodiments, the display device is a product or component having a display function, such as a cell phone, a tablet computer, a notebook computer, a display, a television, a digital photo frame, or a navigator.

Figure 9A:
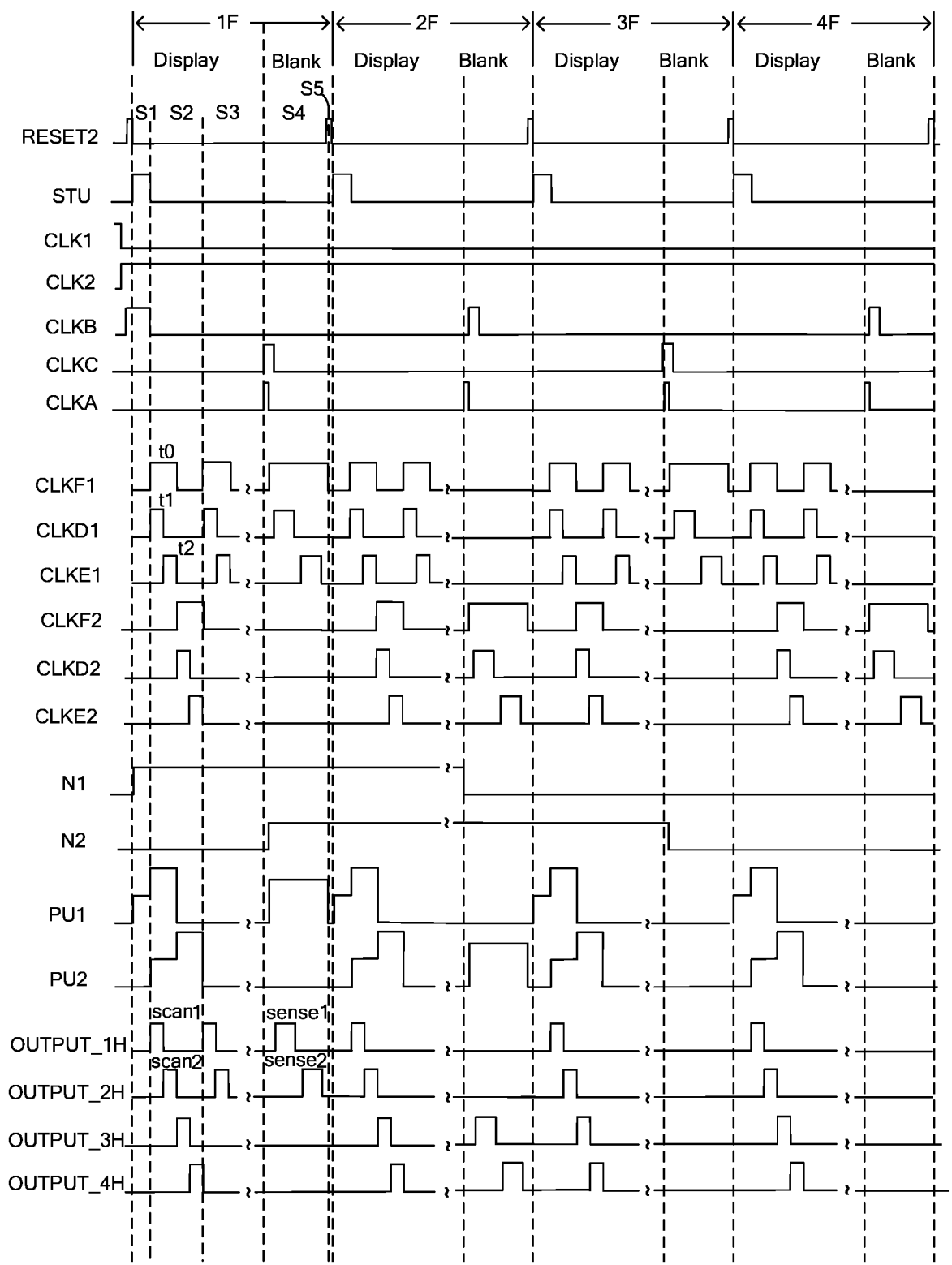
FIG. 9A is a timing diagram of control signals of a shift register, in accordance with some embodiments.
Figure 9B:
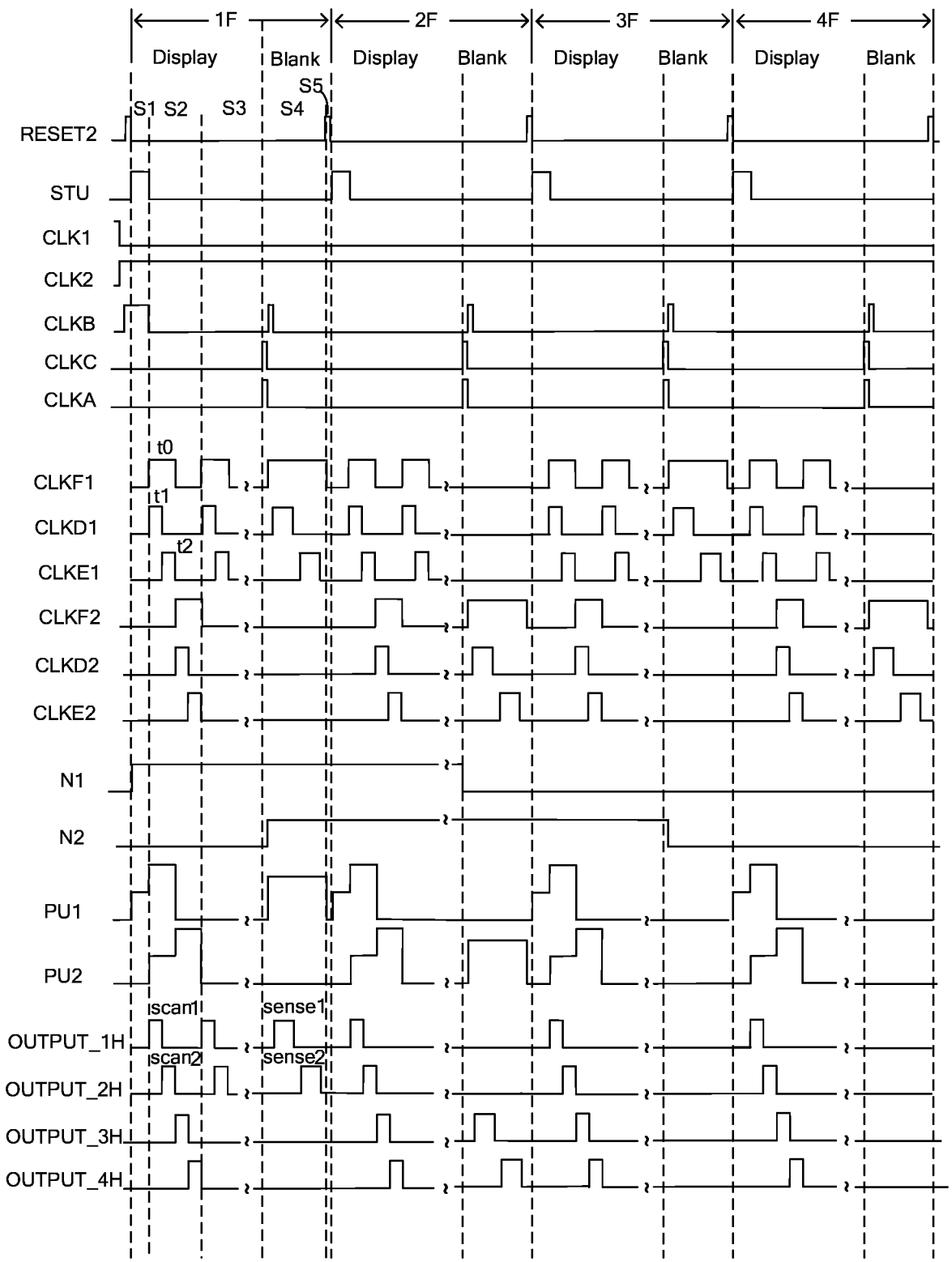
FIG. 9B is a timing diagram of control signals of another shift register, in accordance with some embodiments.

Some embodiments of the present disclosure further provide a method of driving a shift register RS. The method is configured to drive the shift register RS as described in any of the above embodiments. Please refer to FIGS. 3, 4, 8A to 9B, among which FIGS. 9A and 9B are timing diagrams of two stages of shift register RS coupled in cascade, and the two stages of shift register RS coupled in cascade are a first-stage shift register RS1 and a second-stage shift register RS2, respectively. In a display process, an image frame includes a display period Display. In the display period Display, the method includes the following steps.

In a first display period S1 of the display period:

The pull-up control circuit 30 receives an input signal, transmits the received first voltage signal to the pull-up node PU under the control of the input signal, and stores the potential of the pull-up node PU; under the control of a potential of the pull-up node PU, each of the at least two output circuits 10 transmits a non-operating voltage of a corresponding clock signal to a corresponding one of the at least two output signal terminals. Herein, the corresponding clock signal is from a corresponding one of at least two clock signal terminals to which each output circuit is coupled.

For example, by combining FIGS. 3, 9A, and 9B, it may be seen that in S1, after the first transistor M1 receives the input signal transmitted by the input signal terminal INPUT (since the input signal terminal INPUT of the first-stage shift register RS is configured to receive a start signal Stu from the start signal terminal STU, and the start signal Stu is served as the input signal Input), the first transistor M1 is turned on under the control of the input signal Input, and transmits a voltage of the first voltage signal Vdd from the first voltage terminal VDD to the pull-up node PU, in this process, the voltage of the first voltage signal Vdd are stored in the first capacitor C1 and the second capacitor C2 respectively. Moreover, under the control of the potential of the pull-up node PU, the tenth transistor M10 and the eleventh transistor M11 are turned on; then the tenth transistor M10 transmits a received non-operating voltage of the fourth clock signal terminal CLKD (the voltage is for example at a low level) to the first output signal terminal OUTPUT1; and the eleventh transistor M11 transmits a received non-operating voltage of the fifth clock signal terminal CLKE (the voltage is for example at a low level) to the second output signal terminal OUTPUT2.

Herein, before S1, the fourth transistor M4 is turned on under the control of the first control signal Clk1 from the first control signal terminal CLK1, and transmits a high potential of the received first control signal Clk1 to the pull-down node PD, so as to ensure that the pull-down node PD is at a high level. In this way, the twelfth transistor M12 and the thirteenth transistor M13 are turned on under the control of the potential of the pull-down node PD; then the twelfth transistor M12 transmits the received third voltage signal Vgl3 (which is for example a low level signal) to the first output signal terminal OUTPUT1; and the thirteenth transistor M13 transmits the received third voltage signal Vgl3 (the signal is, for example, a low level signal) to the second output signal terminal OUTPUT2, so as to reset the first output signal terminal OUTPUT1 and the second output signal terminal OUTPUT2 respectively.

In a second display period S2 of the display period:

The pull-up control circuit 30 discharges the pull-up node PU; under the control of a potential of the pull-up node PU, each of the at least two output circuits transmits an operating voltage of the corresponding clock signal as a scanning signal to a corresponding one of the at least two output signal terminals.

For example, by combining FIGS. 3, 9A, and 9B, it may be seen that in S2, since the input signal terminal INPUT is at a low level, the first transistor M1 is in a turned-off state, and the potential of the pull-up node PU is floating. in this case, the fourth clock signal Clkd changes from a low level signal to a high level signal, and the tenth transistor M10 is still in a turned-on state under the control of the potential of the pull-up node PU. Therefore, it may be ensured that the fourth clock signal Clkd is transmitted to the first output signal terminal OUTPUT1, so that a potential of an end of the first capacitor C1 coupled to the first output signal terminal OUTPUT1 is changed from a low potential to a high potential. Due to the bootstrap characteristics of capacitors, the potential of the one end of the first capacitor C1 coupled to the pull-up node PU is boosted by the fourth clock signal Clkd, so that the potential of the pull-up node PU continues to rise. in this case, under the control of the potential of the pull-up node PU, the tenth transistor M10 is kept in a turned-on state, and transmits an operating voltage (i.e., a high potential voltage) of the received fourth clock signal terminal CLKD as a first scanning signal scan1 to the first output signal terminal OUTPUT1.

Similarly, the fifth clock signal Clke changes from a low level signal to a high level signal, and the eleventh transistor M11 is still in a turned-on state under the control of the potential of the pull-up node PU, and transmits the fifth clock signal Clke to the second output signal terminal OUTPUT2. A potential of an end of the second capacitor C2 coupled to the second output signal terminal OUTPUT2 is changed from a low potential to a high potential, therefore the potential of the one end of the second capacitor C2 coupled to the pull-up node PU is boosted by the fifth clock signal Clke, so that the potential of the pull-up node PU continues to rise. in this case, under the control of the potential of the pull-up node PU, the eleventh transistor M11 is kept in a turned-on state, and transmits an operating voltage of the received fifth clock signal terminal CLKE as a second scanning signal scans to the second output signal terminal OUTPUT2.

In a third display period S3 of the display period:

The pull-up control circuit 30 receives a first reset signal Reset1, and transmits a received second voltage signal Vgl2 to the pull-up node PU under the control of the first reset signal Reset1; the pull-down control circuit 40 receives a first control signal Clk1, and transmits the first control signal Clk1 to the pull-down node PD; under the control of a potential of the pull-down node PD, each of the at least two pull-down circuits transmits the received third voltage signal Vgl3 to a corresponding one of the at least two output signal terminals, so as to reset the corresponding one of the at least two output signal terminals.

For example, by combining FIGS. 3, 9A, and 9B, it may be seen that in S3, the third transistor M3 receives the first reset signal Reset1 from the first reset signal terminal RESET1; under the control of the first reset signal Reset1, the third transistor M3 is turned on, and transmits a received voltage of the second voltage terminal VGL2 to the pull-up node PU, so as to reset the present-stage shift register RS including the above elements.

Moreover, in S3, since the first control signal Clk1 from the first control signal terminal CLK1 is a high level signal; under the control of the first control signal Clk1, the fourth transistor M4 is turned on, and transmits the received first control signal Clk1 to the pull-down node PD, so as to ensure that the pull-down node PD is at a high level and reset the first output signal terminal OUTPUT1 and the second output signal terminal OUTPUT2. A reset principle can be seen in the foregoing description, and will not be described here again.

In some embodiments, the shift register RS further includes a detection control circuit 50. Correspondingly, the method further includes in S1, the detection control circuit 50 stores a voltage of the input signal under the control of the second clock signal Clkb.

For example, by combining FIGS. 3, 9A, and 9B, it may be seen that in S1, the sixth transistor M6 is turned on under the control of the second clock signal Clkb from the second clock signal terminal CLKB and the start signal Stu from the input signal terminal Input; moreover, the voltage of the start signal Stu is stored to the fourth capacitor C4, so that the fourth capacitor C4 will be discharged at a subsequent fourth display period S4 of the present image frame.

In a case where the image frame further includes a blank period Blank after the display period, in the blank period Blank, the method further includes the following steps.

In a fourth display period S4 of the blank period:

The detection control circuit 50 releases a stored voltage, receives a first clock signal Clka, and transmits the first clock signal Clka to the pull-up node PU; under the control of a potential of the pull-up node PU, each of the at least two output circuits transmits an operating voltage of the corresponding clock signal as a detection signal to a corresponding one of the at least two output signal terminals.

For example, by combining FIGS. 3, 9A, and 9B, it may be seen that in S4, since the input signal from the input signal terminal INPUT is a low level signal, and in this period, the second clock signal terminal CLKB does not transmit the second clock signal Clkb, so that the sixth transistor M6 is in a turned-off state. Due to the bootstrap characteristics of capacitors, the fourth capacitor C4 is discharged at the first node N1, so as to keep a potential of the first node N1 at a high potential. The seventh transistor M7 is turned on under the control of the potential of the first node N1; in this period, the first clock signal Clka is input into the eighth transistor M8; the eighth transistor M8 is turned on under the control of the received first clock signal Clka; and the seventh transistor M7 and the eighth transistor M8 transmit the third clock signal Clkc from the third clock signal terminal CLKC to the pull-up node PU. Under the control of the potential of the pull-up node PU, the tenth transistor M10 and the eleventh transistor M11 are turned on; the tenth transistor M10 transmits an operating voltage of the received fifth clock signal Clke as a first detection signal to the first output signal terminal OUTPUT1; and the eleventh transistor M11 transmits an operating voltage of the received sixth clock signal Clkf as a second detection signal to the second output signal terminal OUTPUT2.

In a case where image frames other than a first image frame 1F (for example, a second image frame 2F, a third image frame 3F, . . . ), are in a working state in the blank period Blank of a previous image frame (that is, in a case where the first detection signal sense1 and the second detection signal sense2 are being output), the second clock signal terminal CLKB receives the second clock signal Clkb, and at the same time, the input signal terminal INPUT receives a corresponding signal (i.e., the cascade signal); the voltage of the corresponding signal transmitted by the input signal terminal INPUT is stored to the fourth capacitor C4, which will be maintained in a current state until being discharged in a fourth period S4 of the next image frame.

In addition, in a connection mode in FIG. 8A, since the second clock signal terminal CLKB and the third clock signal terminal CLKC of adjacent two stages of shift registers RS are alternately coupled to the second clock signal line CLKB' and the third clock signal line CLKC', when a present-stage shift register RS is in a working state in a blank period Blank of an image frame, the third clock signal line CLKB' will transmit a third clock signal Clkc to the second clock signal terminal CLKB of a next-stage shift register RS of the present-stage shift register RS, and transmit a corresponding signal (i.e., the cascade signal) to the input signal terminal INPUT of the next-stage shift register RS at the same time, so as to make the next-stage shift register RS store the voltage of a signal from the input signal terminal INPUT to the fourth capacitor C4, which will be maintained in a current state until being discharged in a fourth period S4 of the next image frame.

For example, referring to FIG. 9A, in a case where the first detection signal and the second detection signal are being output in S4 of a blank period Blank of a present image frame (e.g., the first image frame), in a present-stage shift register RS (e.g., the first-stage shift register), the third clock signal Clkc from the third clock signal terminal CLKC is also served as the second clock signal Clkb received by the second clock signal terminal CLKB of the next-stage shift register RS (e.g., the second-stage shift register), thereby ensuring that the next-stage shift register RS operates normally in the blank period Blank of a next image frame (e.g., the second image frame).

In a fifth display period S5 of the blank period:

The detection control circuit 50 receives the second reset signal Reset2, and transmits the second voltage signal Vgl2 to the pull-up node PU; the pull-down control circuit 40 receives the first control signal Clk1, and transmits the first control signal Clk1 to the pull-down node PD; under the control of a potential of the pull-down node PD, each of the at least two pull-down circuits transmits the third voltage signal Vgl3 to a corresponding one of the at least two output signal terminals, so as to reset the corresponding one of the at least two output signal terminals.

For example, by combining FIGS. 3, 9A, and 9B, it may be seen that in S5, the ninth transistor M9 is turned on under the control of the second reset signal Reset2 from the second reset signal terminal RESET2, and transmits a voltage of the received second voltage terminal VGL2 to the pull-up node PU. In this case, the pull-up node PU is at a low level, and the tenth transistor M10 and the eleventh transistor M11 are turned off, so as to reset the present-stage shift register RS.

In S5, since the first control signal Clk1 from the first control signal terminal CLK1 is a high level signal, and the fourth transistor M4 is turned on under the control of the first control signal Clk1, and outputs the first control signal Clk1 to the pull-down node PD; under the control of a potential of the pull-down node PD, the twelfth transistor M12 and the thirteenth transistor M13 are turned on; the twelfth transistor M12 transmits a voltage of the third voltage terminal VGL3 (the voltage is, for example, a low potential voltage) to the first output signal terminal OUTPUT1; the thirteenth transistor M13 transmits the voltage of the third voltage terminal VGL3 to the second output signal terminal OUTPUT2, so as to reset the present-stage shift register RS.

In some embodiments, the shift register RS further includes a cascade output circuit 11, a cascade pull-down circuit 12, and a cascade signal output terminal OUTPUT'. Correspondingly, the method further includes the following steps.

In S1, under the control of the potential of a pull-up node PU, the cascade output circuit 11 transmits a non-operating voltage of a sixth clock signal Clkf from a sixth clock signal terminal CLKF to the cascade signal output terminal OUTPUT'.

In S2, under the control of a potential of the pull-up node PU, the cascade output circuit 11 transmits an operating voltage of the sixth clock signal Clkf as a cascade signal to the cascade signal output terminal OUTPUT'.

In S3, under the control of a potential of the pull-down node PD, the cascade pull-down circuit 12 transmits the second voltage signal Vgl2 to the cascade signal output terminal OUTPUT', so as to reset the cascade signal output terminal OUTPUT'.

It will be noted that, in a case where the shift register RS includes a cascade output circuit 11, a cascade pull-down circuit 12, and a cascade signal output terminal OUTPUT', the capacitor in the first energy storage sub-circuit 304 is the above third capacitor C3; one end of the third capacitor C3 is coupled to the pull-up node PU, and the other end of the third capacitor C3 is coupled to the cascade signal output terminal OUTPUT'.

For example, by combining FIGS. 4, 9A, and 9B, it may be seen that in S1, the fourteenth transistor M14 is turned on under the control of the potential of the pull-up node PU, and transmits the non-operating voltage of the sixth clock signal Clkf from the sixth clock signal terminal CLKF to the cascade signal output terminal OUTPUT'.

In S2, since the input signal from the input signal terminal INPUT is a low level signal, the first transistor M1 is in a turned-off state, and the potential of the pull-up node PU is floating. In this case, the sixth clock signal Clkf changes from a low potential to a high potential, and the fourteenth transistor M14 is still in a turned-on state under the control of the potential of the pull-up node PU. Therefore, it may be ensured that the sixth clock signal Clkf is transmitted to the cascade output signal terminal OUTPUT', so that a potential of an end of the first capacitor C1 coupled to the cascade output signal terminal OUTPUT' is changed from a low potential to a high potential. Due to the bootstrap characteristics of capacitors, the potential of the one end of the first capacitor C1 coupled to the pull-up node PU is boosted by the sixth clock signal Clkf, so that the potential of the pull-up node PU rises. The fourteenth transistor M14 is turned on under the control of the potential of the pull-up node PU, and transmits the operating voltage of the received sixth clock signal Clkf as a cascade signal to the cascade signal output terminal OUTPUT'.

Moreover, the tenth transistor M10 is turned on under the potential control of the pull-up node PU, and it may be ensured that the operating voltage (i.e., the high potential voltage) of the fourth clock signal Clkd is transmitted as a first scan signal scant to the first output signal terminal OUTPUT1. The eleventh transistor M11 is kept in a turned-on state, and it may be ensured that the operating voltage (i.e., the high potential voltage) of the fifth clock signal Clke is transmitted as a second scan signal scan2 to the second output signal terminal OUTPUT2.

In some embodiments, in S1, as shown in FIGS. 9A and 9B, a period in which a voltage of the sixth clock signal Clkf from the sixth clock signal CLKF is the operating voltage is t0; a period in which a voltage of the fourth clock signal Clkd is the operating voltage is t1; and a period in which a voltage of the fifth clock signal Clke is the operating voltage is t2. A start time of t0 is not later than a start time of t1, and an end time of t0 is not earlier than an end time of t2. In this manner, when the tenth transistor M10 transmits the fourth clock signal Clkd and the eleventh transistor M11 transmits the fifth clock signal Clke, the sixth clock signal Clkf may keep the end of the first capacitor C1 coupled to the pull-up node PU at a high potential, thereby ensuring that the tenth transistor M10 and the eleventh transistor M11 will not be turned off when the fifth clock signal terminal CLKE and the six clock signal terminal CLKF transmit respective working voltages.

In S3, the fifteenth transistor M15 is turned on under the control of a potential of the pull-down node PD, and transmits the received second voltage signal Vgl2 to the cascaded signal output terminal OUTPUT', so as to reset the cascaded signal output terminal OUTPUT'.

It will be noted that FIGS. 9A and 9B are respectively timing diagrams of first four exemplary image frames (i.e., 1F, 2F, 3F, and 4F) during a process in which the gate driving circuit 100 shown in FIGS. 8A and 8B drives the gate lines.

In some embodiments, clock signals respectively received by the second clock signal terminal CLKB, the third clock signal terminal CLKC, the sixth clock signal terminal CLKF, the fifth clock signal terminal CLKE, and the seventh clock signal terminal CLKG are clock signals with adjustable pulse widths. That is, a pulse width of a clock signal from each clock signal terminal is not fixed, and can be adjusted according to connection manners in the circuits and actual needs. For example, in the connection mode shown in FIG. 8A, a pulse width relationship between the clock signals is a pulse width relationship as shown in FIG. 9A. while, in a connection mode shown in FIG. 8B, the pulse width relationship between the clock signals is a pulse width relationship as shown in FIG. 9B. Obviously, the pulse width relationships shown in FIG. 9A and FIG. 9B are different, and it may be seen that the clock signal received by the clock signal terminals are clock signals with adjustable pulse widths.

In some embodiments, the first control signal Clk1 received by the first control signal terminal CLK1 and the second control signal Clk2 received by the second control signal terminal CLK2 are both low frequency clock signals, or are both DC signals. As for types of signals, reference may be made to the previous descriptions of the first control signal Clk1 and the second control signal Clk2, and details are not described herein again.

Referring to FIGS. 8A to 9B, timings of respective control signals during operation of the first-stage shift register RS1 and the second-stage shift register RS2 are explained as follows.

Since the second reset signal terminals RESET2 in the two stages of shift registers RS are coupled to the same second reset signal line RESET2', the timing of RESET2 shown in FIGS. 9A and 9B may represent the timing of the second reset signal Reset2 in the first-stage shift register RS1, and may also represent the timing of the second reset signal Reset2 in the second-stage shift register RS2.

Similarly, timings of CLK1, CLK2, CLKA, CLKB, and CLKC may represent the timing of a corresponding signal in the first-stage shift register RS1, and may also represent the timing of a corresponding signal in the second-stage shift register RS2, the details of which will not be repeated here.

Since the input signal terminal INPUT of the first-stage shift register RS1 is coupled to the start signal terminal STU, the timing of the start signal terminal STU shown in FIGS. 9A and 9B represents the timing of the input signal Input in the first-stage shift register RS1.

The timing of CLKD1 shown in FIGS. 9A and 9B represents a timing of the fourth clock signal Clkd in the first-stage shift register RS1.

The timing of CLKE1 shown in FIGS. 9A and 9B represents a timing of the fifth clock signal Clke in the first-stage shift register RS1.

The timing of CLKD2 shown in FIGS. 9A and 9B represents a timing of the fourth clock signal Clkd in the second-stage shift register RS2.

The timing of CLKE2 shown in FIGS. 9A and 9B represents a timing of the fifth clock signal Clke in the second-stage shift register RS2.

The timing of N1 shown in FIGS. 9A and 9B represents a timing of a potential change of the first node N1 in the first-stage shift register RS1.

The timing of N2 shown in FIGS. 9A and 9B represents a timing of a potential change of the first node N1 in the second-stage shift register RS2.

The timing of PU1 shown in FIGS. 9A and 9B represents a timing of a potential change of the pull-up node PU in the first-stage shift register RS1.

The timing of PU2 shown in FIGS. 9A and 9B represents a timing of a potential change of the pull-up node PU in the second-stage shift register RS2.

The timing of OUTPUT1_1H shown in FIGS. 9A and 9B represents a timing of a signal transmitted by the first output signal terminal OUTPUT1 in the first-stage shift register RS1. The signal transmitted by the first output signal terminal OUTPUT1 includes the first scanning signal scan1 in the display period Display and the first detection signal sense1 in the blank period Blank.

The timing of OUTPUT2_2H shown in FIGS. 9A and 9B represents a timing of a signal transmitted by the second output signal terminal OUTPUT2 in the first-stage shift register RS1. The signal transmitted by the second output signal terminal OUTPUT2 includes the second scanning signal scan2 in the display period Display and the second detection signal sense2 in the blank period Blank.

The timing of OUTPUT1_3H shown in FIGS. 9A and 9B represents a timing of a signal transmitted by the first output signal terminal OUTPUT1 in the second-stage shift register RS2.

The timing of OUTPUT2_4H shown in FIGS. 9A and 9B represents a timing of a signal transmitted by the second output signal terminal OUTPUT2 in the second-stage shift register RS2.

In the description of the above embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A shift register, comprising: a pull-up control circuit, at least two output circuits, a pull-down control circuit, at least two pull-down circuits, a detection control circuit and at least two output signal terminals, wherein the pull-up control circuit, the at least two output circuits, and the pull-down control circuit are respectively coupled to a pull-up node; the pull-down control circuit, the at least two pull-down circuits, and the pull-up control circuit are respectively coupled to a pull-down node;

each of the at least two output circuits is coupled to a corresponding one of the at least two output signal terminals; each of the at least two pull-down circuits is coupled to a corresponding one of the at least two output signal terminals; and each of the at least two output signal terminals is coupled to a corresponding one of at least two gate lines;

the detection control circuit is coupled to the pull-up node and configured to receive a third clock signal, and transmit the third clock signal to the pull-up node under control of a first clock signal and a second clock signal; wherein the detection control circuit includes: a detection input sub-circuit, a second energy storage sub-circuit, an energy storage control sub-circuit, and a second reset sub-circuit, wherein the detection input sub-circuit, the second energy storage sub-circuit, and the energy storage control sub-circuit are respectively coupled to a first node; the energy storage control sub-circuit and the second reset sub-circuit are respectively coupled to the pull-up node;

the detection input sub-circuit is configured to receive an input signal, and transmit the input signal to the first node under control of the second clock signal; the detection input sub-circuit includes a sixth transistor; a gate of the sixth transistor is coupled to a second clock signal terminal that is configured to transmit the second clock signal, a first electrode of the sixth transistor is coupled to an input signal terminal that is configured to transmit the input signal, and a second electrode of the sixth transistor is coupled to the first node;

the second energy storage sub-circuit is configured to store a potential of the first node and discharge the first node; the second energy storage sub-circuit includes a fourth capacitor; one end of the fourth capacitor is coupled to the first node, and another end of the fourth capacitor is coupled to a second voltage terminal that is configured to transmit a second voltage signal;

the energy storage control sub-circuit is configured to receive a third clock signal, and transmit the third clock signal to the pull-up node under control of the potential of the first node and the first clock signal; the energy storage control sub-circuit includes a seventh transistor and an eighth transistor; a gate of the seventh transistor is coupled to the first node, a first electrode of the seventh transistor is coupled to a third clock signal terminal that is configured to transmit the third clock signal, and a second electrode of the seventh transistor is coupled to a first electrode of the eighth transistor; a gate of the eighth transistor is coupled to a first clock signal terminal that is configured to transmit the first clock signal, and a second electrode of the eighth transistor is coupled to the pull-up node;

the second reset sub-circuit is configured to receive the second voltage signal, and transmit the second voltage signal to the pull-up node under control of a second reset signal; the second reset sub-circuit includes a ninth transistor; a gate of the ninth transistor is coupled to a second reset signal terminal that is configured to transmit the second reset signal, a first electrode of the ninth transistor is coupled to the second voltage terminal, and a second electrode of the ninth transistor is coupled to the pull-up node;

the pull-up control circuit is configured to receive a first voltage signal, and transmit the first voltage signal to the pull-up node;

each of the at least two output circuits is configured to transmit a scanning signal to a corresponding output signal terminal under control of a potential of the pull-up node;

the pull-down control circuit is configured to receive a first control signal, and transmit the first control signal to the pull-down node; and each of the at least two pull-down circuits is configured to reset a corresponding output signal terminal under control of a potential of the pull-down node.

2. The shift register according to claim 1, wherein the pull-up control circuit is further configured to receive a second voltage signal;

the pull-up control circuit includes: a first pull-up control sub-circuit, a second pull-up control sub-circuit, a first reset sub-circuit, and a first energy storage sub-circuit that are respectively coupled to the pull-up node, wherein the first pull-up control sub-circuit is configured to transmit the first voltage signal to the pull-up node under control of an input signal;

the second pull-up control sub-circuit is further coupled to the pull-down node, and is configured to transmit the second voltage signal to the pull-up node under control of the potential of the pull-down node;

the first reset sub-circuit is configured to transmit the second voltage signal to the pull-up node under control of a first reset signal;

the first energy storage sub-circuit is configured to store a potential of the pull-up node and discharge the pull-up node;

the pull-down control circuit includes: a first pull-down control sub-circuit and a second pull-down control sub-circuit that are respectively coupled to the pull-down node, wherein the first pull-down control sub-circuit is configured to transmit the first control signal to the pull-down node under control of the first control signal; and the second pull-down control sub-circuit is further coupled to the pull-up node, and is configured to transmit the second voltage signal to the pull-down node under control of the potential of the pull-up node.

3. The shift register according to claim 2, wherein in the pull-up control circuit:
the first pull-up control sub-circuit includes a first transistor; a gate of the first transistor is coupled to an input signal terminal that is configured to transmit the input signal, a first electrode of the first transistor is coupled to a first voltage terminal that is configured to transmit the first voltage signal, and a second electrode of the first transistor is coupled to the pull-up node;
the second pull-up control sub-circuit includes a second transistor; a gate of the second transistor is coupled to the pull-down node, a first electrode of the second transistor is coupled to a second voltage terminal that is configured to transmit the second voltage signal, and a second electrode of the second transistor is coupled to the pull-up node;
the first reset sub-circuit includes a third transistor; a gate of the third transistor is coupled to a first reset signal terminal that is configured to transmit the first reset signal, a first electrode of the third transistor is coupled to the second voltage terminal, and a second electrode of the third transistor is coupled to the pull-up node; and
the first energy storage sub-circuit includes at least two capacitors, one end of each of the at least two capacitors is coupled to the pull-up node, and another end of each of the at least two capacitors is coupled to a corresponding one of the at least two output signal terminals; or, the first energy storage sub-circuit includes a third capacitor, one end of the third capacitor is coupled to the pull-up node, and another end of the third capacitor is coupled to a cascade signal output terminal that is configured to transmit a cascade signal;
in the pull-down control circuit:
the first pull-down control sub-circuit includes a fourth transistor; a gate and a first electrode of the fourth transistor are respectively coupled to a first control signal terminal configured to transmit the first control signal, and a second electrode of the fourth transistor is coupled to the pull-down node;
the second pull-down control sub-circuit includes a fifth transistor; a gate of the fifth transistor is coupled to the pull-up node, a first electrode of the fifth transistor is coupled to the second voltage terminal, and a second electrode of the fifth transistor is coupled to the pull-down node.

4. The shift register according to claim 3, wherein
the pull-down control circuit is further configured to receive a second control signal, and transmit the second control signal to the pull-down node;
the pull-down control circuit further includes: a first pull-down control alternate sub-circuit that is coupled to the pull-down node and configured to transmit the second control signal to the pull-down node under control of the second control signal, wherein
the first pull-down control alternate sub-circuit includes an alternate transistor; a gate and a first electrode of the alternate transistor are respectively coupled to a second control signal terminal that is configured to transmit the second control signal, and a second electrode of the alternate transistor is coupled to the pull-down node; and
the first pull-down control sub-circuit and the first pull-down control alternate sub-circuit are configured to work alternately; in a case where the first control signal is a working signal, the second control signal is a turn-off signal, or the second control signal terminal stops transmitting the second control signal; in a case where the second control signal is the working signal, the first control signal is the turn-off signal, or the first control signal terminal stops transmitting the first control signal.

5. The shift register according to claim 1, wherein
each of the at least two output circuits is further configured to output a detection signal to a corresponding output signal terminal under control of the third clock signal received by the pull-up node.

6. The shift register according to claim 1, further comprising: a cascade output circuit, a cascade pull-down circuit, and a cascade signal output terminal, wherein
the cascade output circuit is coupled to the pull-up node and the cascade signal output terminal, and is configured to output a cascade signal to the cascade signal output terminal under control of the potential of the pull-up node; the cascade output circuit includes at least one transistor; a gate of one transistor of the at least one transistor is coupled to the pull-up node, a first electrode of the transistor is coupled to a fourth clock signal terminal that is configured to transmit a fourth clock signal, and a second electrode of the transistor is coupled to the cascade signal output terminal; and
the cascade pull-down circuit is coupled to the pull-down node and the cascade signal output terminal, and is configured to reset the cascade signal output terminal under control of the potential of the pull-down node; the cascade pull-down circuit includes at least one transistor; a gate of one transistor of the at least one transistor is coupled to the pull-down node, a first electrode of the transistor is coupled to a second voltage terminal that is configured to transmit a second voltage signal, and a second electrode of the transistor is coupled to the cascade signal output terminal.

7. The shift register according to claim 1, wherein
each output circuit includes at least one transistor; a gate of one transistor of the at least one transistor is coupled to the pull-up node, a first electrode of the transistor is coupled to a corresponding clock signal terminal, and a second electrode of the transistor is coupled to a corresponding one of the at least two output signal terminals; and
each pull-down circuit includes at least one transistor; a gate of one transistor of the at least one transistor is coupled to the pull-down node, a first electrode of the transistor is coupled to a third voltage terminal that is configured to transmit a third voltage signal, and a second electrode of the transistor is coupled to a corresponding one of the at least two output signal terminals.

8. The shift register according to claim 1, wherein
the at least two output circuits include a first output circuit and a second output circuit;
the at least two pull-down circuits include a first pull-down circuit and a second pull-down circuit;
the at least two output signal terminals include a first output signal terminal and a second output signal terminal; and
the first output circuit and the first pull-down circuit are respectively coupled to the first output signal terminal, and the second output circuit and the second pull-down circuit are respectively coupled to the second output signal terminal.

9. The shift register according to claim 8, wherein
the pull-up control circuit is further configured to receive a second voltage signal;
the pull-up control circuit includes: a first transistor, a second transistor, a third transistor, a first capacitor, and a second capacitor, wherein
a gate of the first transistor is coupled to an input signal terminal that is configured to transmit an input signal, a first electrode of the first transistor is coupled to a first voltage terminal that is configured to transmit a first voltage signal, and a second electrode of the first transistor is coupled to the pull-up node;
a gate of the second transistor is coupled to the pull-down node, a first electrode of the second transistor is coupled to a second voltage terminal that is configured to transmit a second voltage signal, and a second electrode of the second transistor is coupled to the pull-up node;
a gate of the third transistor is coupled to a first reset signal terminal that is configured to transmit a first reset signal, a first electrode of the third transistor is coupled to the second voltage terminal, and a second electrode of the third transistor is coupled to the pull-up node;
one end of the first capacitor is coupled to the pull-up node, and another end of the first capacitor is coupled to the first output signal terminal; and
one end of the second capacitor is coupled to the pull-up node, and another end of the second capacitor is coupled to the second output signal terminal;
the pull-down control circuit includes: a fourth transistor and a fifth transistor, wherein
a gate and a first electrode of the fourth transistor are respectively coupled to a first control signal terminal that is configured to transmit the first control signal, and a second electrode of the fourth transistor is coupled to the pull-down node; and
a gate of the fifth transistor is coupled to the pull-up node, a first electrode of the fifth transistor is coupled to the second voltage terminal, and a second electrode of the fifth transistor is coupled to the pull-down node;
the first output circuit includes a tenth transistor; a gate of the tenth transistor is coupled to the pull-up node, a first electrode of the tenth transistor is coupled to a fourth clock signal terminal that is configured to transmit a fourth clock signal, and a second electrode of the tenth transistor is coupled to the first output signal terminal;
the second output circuit includes an eleventh transistor; a gate of the eleventh transistor is coupled to the pull-up node, a first electrode of the eleventh transistor is coupled to a fifth clock signal terminal that is configured to transmit a fifth clock signal, and a second electrode of the eleventh transistor is coupled to the second output signal terminal;
the first pull-down circuit includes a twelfth transistor; a gate of the twelfth transistor is coupled to the pull-down node, a first electrode of the twelfth transistor is coupled to a third voltage terminal that is configured to transmit a third voltage signal, and a second electrode of the twelfth transistor is coupled to the first output signal terminal;
the second pull-down circuit includes a thirteenth transistor; a gate of the thirteenth transistor is coupled to the pull-down node, a first electrode of the thirteenth transistor is coupled to the third voltage terminal, and a second electrode of the thirteenth transistor is coupled to the second output signal terminal;

transistors comprised in the shift register are all N-type transistors;
the first voltage signal is a high level voltage signal, the second voltage signal is a low level voltage signal, and the third voltage signal is a low level voltage signal; and a voltage value of the second voltage signal is less than or equal to a voltage value of the third voltage signal.

10. The shift register according to claim 8, wherein
the pull-up control circuit is further configured to receive a second voltage signal;
the pull-up control circuit includes: a first transistor, a second transistor, a third transistor, and a third capacitor, wherein
a gate of the first transistor is coupled to an input signal terminal that is configured to transmit an input signal, a first electrode of the first transistor is coupled to a first voltage terminal that is configured to transmit a first voltage signal, and a second electrode of the first transistor is coupled to the pull-up node;
a gate of the second transistor is coupled to the pull-down node, a first electrode of the second transistor is coupled to a second voltage terminal that is configured to transmit the second voltage signal, and a second electrode of the second transistor is coupled to the pull-up node;
a gate of the third transistor is coupled to a first reset signal terminal that is configured to transmit a first reset signal, a first electrode of the third transistor is coupled to the second voltage terminal, and a second electrode of the third transistor is coupled to the pull-up node;
one end of the third capacitor is coupled to the pull-up node, and another end of the third capacitor is coupled to a cascade signal output terminal that is configured to transmit a cascade signal;
the pull-down control circuit includes: a fourth transistor and a fifth transistor, wherein
a gate and a first electrode of the fourth transistor are respectively coupled to a first control signal terminal that is configured to transmit the first control signal, and a second electrode of the fourth transistor is coupled to the pull-down node;
a gate of the fifth transistor is coupled to the pull-up node, a first electrode of the fifth transistor is coupled to the second voltage terminal, and a second electrode of the fifth transistor is coupled to the pull-down node;
the first output circuit includes a tenth transistor; a gate of the tenth transistor is coupled to the pull-up node, a first electrode of the tenth transistor is coupled to a fourth clock signal terminal that is configured to transmit a fourth clock signal, and a second electrode of the tenth transistor is coupled to the first output signal terminal;
the second output circuit includes an eleventh transistor; a gate of the eleventh transistor is coupled to the pull-up node, a first electrode of the eleventh transistor is coupled to a fifth clock signal terminal that is configured to transmit a fifth clock signal, and a second electrode of the eleventh transistor is coupled to the second output signal terminal;
the first pull-down circuit includes a twelfth transistor; a gate of the twelfth transistor is coupled to the pull-down node, a first electrode of the twelfth transistor is coupled to a third voltage terminal that is configured to transmit a third voltage signal, and a second electrode of twelfth transistor is coupled to the first output signal terminal;

the second pull-down circuit includes a thirteenth transistor; a gate of the thirteenth transistor is coupled to the pull-down node, a first electrode of the thirteenth transistor is coupled to the third voltage terminal, and a second electrode of the thirteenth transistor is coupled to the second output signal terminal;

the shift register further comprises: a cascade output circuit, a cascade pull-down circuit, and a cascade signal output terminal, wherein the cascade output circuit includes a fourteenth transistor; a gate of the fourteenth transistor is coupled to the pull-up node, a first electrode of the fourteenth transistor is coupled to a sixth clock signal terminal that is configured to transmit a sixth clock signal, and a second electrode of the fourteenth transistor is coupled to the cascade signal output terminal;

the cascade pull-down circuit includes a fifteenth transistor; a gate of the fifteenth transistor is coupled to the pull-down node, a first electrode of the fifteenth transistor is coupled to the second voltage terminal, and a second electrode of the fifteenth transistor is coupled to the cascade signal output terminal;

transistors comprised in the shift register are N-type transistors;

the first voltage signal is a high level voltage signal, the second voltage signal is a low level voltage signal, and the third voltage signal is a low level voltage signal; and a voltage value of the second voltage signal is less than or equal to a voltage value of the third voltage signal.

11. The shift register according to claim 1, further comprising: at least two additional output circuits, at least two additional pull-down circuits, and at least two additional output signal terminals, wherein the at least two additional output circuits are coupled to the pull-up node, and the at least two additional pull-down circuits are coupled to the pull-down node;

each of the at least two additional output circuits is coupled to a corresponding one of the at least two additional output signal terminals, and each of the at least two additional pull-down circuits is coupled to a corresponding one of the at least two additional output signal terminals;

each of the at least two additional output signal terminals is coupled to a corresponding one of the at least two gate lines; the at least two additional output signal terminals are in one-to-one correspondence with the at least two output signal terminals; and a gate line to which each additional output signal terminal is coupled and another gate line to which a corresponding output signal terminal is coupled are configured to drive a same row of sub-pixels;

each of the at least two additional output circuits is configured to output an additional scanning signal to a corresponding additional output signal terminal under control of the first voltage signal at the pull-up node; and each of the at least two additional pull-down circuits is configured to reset a corresponding additional output signal terminal under control of the first control signal at the pull-down node.

12. The shift register according to claim 11, wherein the at least two additional output circuits include a first additional output circuit and a second additional output circuit; the at least two additional pull-down circuits include a first additional pull-down circuit and a second additional pull-down circuit; the at least two additional output signal terminals include a first additional output signal terminal and a second additional output signal terminal;

the first additional output circuit and the first additional pull-down circuit are respectively coupled to the first additional output signal terminal, and the second additional output circuit and the second additional pull-down circuit are respectively coupled to the second additional output signal terminal;

the first additional output circuit includes a sixteenth transistor; a gate of the sixteenth transistor is coupled to the pull-up node, a first electrode of the sixteenth transistor is coupled to a seventh clock signal terminal that is configured to transmit a seventh clock signal, and a second electrode of the sixteenth transistor is coupled to the first additional output signal terminal;

the second additional output circuit includes a seventeenth transistor; a gate of the seventeenth transistor is coupled to the pull-up node, a first electrode of the seventeenth transistor is coupled to an eighth clock signal terminal that is configured to transmit an eighth clock signal, and a second electrode of the seventeenth transistor is coupled to the second additional output signal terminal;

the first additional pull-down circuit includes an eighteenth transistor; a gate of the eighteenth transistor is coupled to the pull-down node, a first electrode of the eighteenth transistor is coupled to a third voltage terminal that is configured to transmit a third voltage signal, and a second electrode of the eighteenth transistor is coupled to the first additional output signal terminal;

the second additional pull-down circuit includes a nineteenth transistor; a gate of the nineteenth transistor is coupled to the pull-down node, a first electrode of the nineteenth transistor is coupled to the third voltage terminal, and a second electrode of the nineteenth transistor is coupled to the second additional output signal terminal.

13. A gate driving circuit, comprising at least two shift registers according to claim 1 coupled in cascade.

14. The gate driving circuit according to claim 13, wherein an input signal terminal of a first-stage shift register is coupled to a start signal terminal that is configured to transmit a start signal;

except for a last-stage shift register, one of at least two output signal terminals of each of remaining stages of shift registers is coupled to an input signal terminal of a next-stage shift register;

except for a first-stage shift register, one of at least two output signal terminals of each of remaining stages of shift registers is coupled to a first reset signal terminal of a previous-stage shift register; and a first reset signal terminal of the last-stage shift register is coupled to a termination signal terminal that is configured to transmit a termination signal.

15. The gate driving circuit according to claim 13, wherein in a case where each stage of shift register further includes a cascade signal output terminal, an input signal terminal of a first-stage shift register is coupled to a start signal terminal that is configured to transmit a start signal;

except for a last-stage shift register, a cascade signal output terminal of each of remaining stages of shift registers is coupled to an input signal terminal of a next-stage shift register;

except for a first-stage shift register, a cascade signal output terminal of each of remaining stages of shift registers is coupled to a first reset signal terminal of a previous-stage shift register; and a first reset signal terminal of the last-stage shift register is coupled to a termination signal terminal that is configured to transmit a termination signal;

in a case where each stage of shift register further includes a sixth clock signal terminal, the gate driving circuit further comprises two sixth clock signal lines;

a sixth clock signal terminal of a shift register in an odd-number-th stage is coupled to one sixth clock signal line of the two sixth clock signal lines; and a sixth clock signal terminal of a shift register in an even-number-th stage is coupled to another sixth clock signal line of the two sixth clock signal lines.

16. A display device, comprising:

the gate driving circuit according to claim 13; and a plurality of gate lines, wherein the plurality of gate lines are divided into at least two gate line groups, and each gate line group includes at least two gate lines that are arranged in sequence;

at least two stages of shift registers in the gate driving circuit are in one-to-one correspondence with the at least two gate line groups, and each of the at least two output signal terminals of each stage of shift register is coupled to a corresponding one of the at least two gate lines of a corresponding gate line group.

17. A method of driving a shift register, configured to drive the shift register according to claim 1, wherein in a case where an image frame includes a display phase, the method comprises:

in a first time period of the display period, receiving, by the pull-up control circuit, a first voltage signal; transmitting, by the pull-up control circuit, the first voltage signal to the pull-up node under control of an input signal; and storing, by the pull-up control circuit, a potential of the pull-up node; storing, by the detection control circuit, a voltage of the input signal under control of a second clock signal;

transmitting, by each of the at least two output circuits, a non-operating voltage of a corresponding clock signal to a corresponding one of the at least two output signal terminals under control of the potential of the pull-up node, the corresponding clock signal being from a corresponding one of at least two clock signal terminals to which each output circuit is connected;

in a second time period of the display period, discharging, by the pull-up control circuit, the pull-up node;

transmitting, by each of the at least two output circuits, an operating voltage of the corresponding clock signal as a scanning signal to a corresponding one of the at least two output signal terminals under control of the potential of the pull-up node;

in a third time period of the display period, receiving, by the pull-up control circuit, a second voltage signal; and transmitting, by the pull-up control circuit, the second voltage signal to the pull-up node under control of a first reset signal;

receiving, by the pull-down control circuit, a first control signal; and transmitting, by the pull-down control circuit, the first control signal to the pull-down node; and receiving, by each of the at least two pull-down circuits, a third voltage signal; and transmitting, by each of the at least two pull-down circuits, the third voltage signal to a corresponding one of the at least two output signal terminals under control of a potential of the pull-down node, so as to reset a corresponding one of the at least two output signal terminals;

in a case where the image frame further includes a blank period after the display period, the method further comprises:

in a fourth time period of the blank period, releasing, by the detection control circuit, a stored voltage; receiving, by the detection control circuit, a first clock signal; and transmitting, by the detection control circuit, the first clock signal to the pull-up node;

transmitting, by each of the at least two output circuits, an operating voltage of the corresponding clock signal as a detection signal to a corresponding one of the at least two output signal terminals under control of the potential of the pull-up node;

in a fifth time period of the blank period, transmitting, by the detection control circuit, the second voltage signal to the pull-up node under control of a second reset signal;

receiving, by the pull-down control circuit, a first control signal; and transmitting, by the pull-down control circuit, the first control signal to the pull-down node; and transmitting, by each of the at least two pull-down circuits, the third voltage signal to a corresponding one of the at least two output signal terminals under control of the potential of the pull-down node, so as to reset the corresponding one of the at least two output signal terminals.

18. The method of driving a shift register according to claim 17, wherein in a case where the shift register further comprises: a cascade output circuit, a cascade pull-down circuit, and a cascade signal output terminal, the method further comprises:

in the first time period, transmitting, by the cascade output circuit, a non-operating voltage of a sixth clock signal from a sixth clock signal terminal to the cascade signal output terminal under control of the potential of the pull-up node;

in the second time period, transmitting, by the cascade output circuit, an operating voltage of the sixth clock signal as a cascade signal to the cascade signal output terminal under control of the potential of the pull-up node; and in the third time period, transmitting, by the cascade pull-down circuit, the second voltage signal to the cascade signal output terminal under control of the potential of the pull-down node, so as to reset the cascade signal output terminal.

* * * * *